US010629546B2

(12) United States Patent
Roh

(10) Patent No.: US 10,629,546 B2
(45) Date of Patent: Apr. 21, 2020

(54) SEMICONDUCTOR DEVICE

(71) Applicant: Samsung Electronics Co., Ltd., Suwon-si, Gyeonggi-do (KR)

(72) Inventor: Jung Hyun Roh, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 16/113,204

(22) Filed: Aug. 27, 2018

(65) Prior Publication Data

US 2019/0235017 A1 Aug. 1, 2019

(30) Foreign Application Priority Data

Jan. 29, 2018 (KR) .................. 10-2018-0010437

(51) Int. Cl.
*H01L 23/00* (2006.01)
*G01R 31/28* (2006.01)
*H01L 23/528* (2006.01)
*H01L 23/522* (2006.01)
*G01R 31/26* (2020.01)
(Continued)

(52) U.S. Cl.
CPC ........ *H01L 23/562* (2013.01); *G01R 31/2607* (2013.01); *G01R 31/2831* (2013.01); *H01L 22/34* (2013.01); *H01L 23/528* (2013.01); *H01L 23/5226* (2013.01); *H01L 23/585* (2013.01)

(58) Field of Classification Search
CPC . G01R 31/2831; H01L 22/34; H01L 23/5226; H01L 23/528; H01L 23/562
See application file for complete search history.

(56) References Cited

U.S. PATENT DOCUMENTS 7,394,070 B2 * 7/2008 Nozoe .................. G01R 31/307
250/306
8,624,401 B2 * 1/2014 Ishikawa ................. H01L 22/34
257/686
(Continued)

FOREIGN PATENT DOCUMENTS

JP        4719569 B2      7/2011
KR    10-0935195 B1      1/2010
(Continued)

*Primary Examiner* — Earl N Taylor
(74) *Attorney, Agent, or Firm* — Harness, Dickey & Pierce, P.L.C.

(57) ABSTRACT

A semiconductor device including a substrate including a central region and a peripheral region surrounding the central region, a semiconductor integrated circuit in the central region, and a three-dimensional crack detection structure in the peripheral region, the three-dimensional crack detection structure surrounding the central region, the three-dimensional crack detection structure including a first pattern, a second pattern, and a third pattern, the first and second patterns extending in a first direction and spaced apart from each other, the third pattern being parallel to an upper surface of the substrate and connecting the first and second patterns to each other, the third pattern including a first portion and a second portion, the first and second portions extending in a second direction and a third direction respectively, the second direction intersecting with the first direction, the third direction intersecting with the first and second directions may be provided.

20 Claims, 36 Drawing Sheets

(51) Int. Cl.
*H01L 21/66* (2006.01)
*H01L 23/58* (2006.01)

(56) References Cited

U.S. PATENT DOCUMENTS

| | | | | |
|---|---|---|---|---|
| 8,796,686 B2* | 8/2014 | Yang | H01L 23/585 257/48 |
| 8,803,308 B2 | 8/2014 | Ishikawa | |
| 8,872,348 B2* | 10/2014 | Yoo | H01L 22/14 257/774 |
| 9,006,739 B2* | 4/2015 | Crain, Jr. | H01L 22/34 257/48 |
| 9,287,184 B2* | 3/2016 | Dennison | H01L 22/14 |
| 9,291,669 B2* | 3/2016 | Lee | G01R 31/2884 |
| 9,293,381 B2 | 3/2016 | Yoo | |
| 9,557,376 B2* | 1/2017 | Dennison | H01L 22/14 |
| 9,768,129 B2* | 9/2017 | Lee | H01L 23/573 |
| 2006/0163477 A1* | 7/2006 | Nozoe | G01R 31/307 250/310 |
| 2006/0189007 A1* | 8/2006 | Aoki | H01L 22/34 438/14 |
| 2007/0262370 A1* | 11/2007 | Okada | H01L 21/78 257/315 |
| 2008/0012572 A1* | 1/2008 | Tsukuda | G01R 31/2884 324/522 |
| 2008/0203388 A1* | 8/2008 | He | H01L 22/32 257/48 |
| 2009/0201043 A1* | 8/2009 | Kaltalioglu | G01R 31/2858 324/750.3 |
| 2011/0221460 A1* | 9/2011 | Trebo | G01R 31/2884 324/750.3 |
| 2012/0292759 A1* | 11/2012 | Ishikawa | H01L 22/34 257/737 |
| 2013/0048980 A1* | 2/2013 | Yang | H01L 23/585 257/48 |
| 2013/0069206 A1* | 3/2013 | Yoshizawa | H01L 22/34 257/620 |
| 2013/0270558 A1* | 10/2013 | Crain, Jr. | H01L 22/34 257/48 |
| 2013/0277857 A1* | 10/2013 | Yoo | H01L 22/14 257/774 |
| 2014/0151702 A1* | 6/2014 | Ishikawa | H01L 22/34 257/48 |
| 2014/0232001 A1* | 8/2014 | Gratz | H01L 21/768 257/762 |
| 2015/0011028 A1* | 1/2015 | Yoo | H01L 22/14 438/17 |
| 2015/0113343 A1* | 4/2015 | Lee | G01R 31/2884 714/727 |
| 2016/0197056 A1* | 7/2016 | Bhowmik | H01L 22/34 257/48 |
| 2016/0211187 A1* | 7/2016 | Zhang | G06F 17/5081 |
| 2016/0218069 A1* | 7/2016 | Yoshizawa | H01L 22/34 |
| 2016/0300800 A1* | 10/2016 | Zeng | H01L 23/562 |
| 2017/0125360 A1* | 5/2017 | Lee | H01L 23/573 |
| 2017/0256504 A1* | 9/2017 | Minami | G01R 31/2644 |
| 2017/0263880 A1* | 9/2017 | Lee | H01L 27/3244 |
| 2018/0315723 A1* | 11/2018 | Singh | H01L 23/5329 |
| 2019/0011496 A1* | 1/2019 | Van Gemert | H01L 21/78 |
| 2019/0148322 A1* | 5/2019 | Singh | H01L 21/78 257/773 |
| 2019/0229065 A1* | 7/2019 | Kim | H01L 24/06 |
| 2019/0235017 A1* | 8/2019 | Roh | G01R 31/2607 |
| 2019/0250208 A1* | 8/2019 | Dhanasekaran | G01R 31/2884 |

FOREIGN PATENT DOCUMENTS

| | | |
|---|---|---|
| KR | 10-2013-0117290 A | 10/2013 |
| KR | 10-1364410 B1 | 2/2014 |
| KR | 10-2015-0046476 A | 4/2015 |

* cited by examiner

US 10,629,546 B2

SEMICONDUCTOR DEVICE

This application claims priority under 35 U.S.C. § 119 to Korean Patent Application No. 10-2018-0010437, filed on Jan. 29, 2018, in the Korean Intellectual Property Office, the disclosure of which is incorporated herein in its entirety by reference.

BACKGROUND

1. Field of the Invention

The present inventive concepts relate to semiconductor devices. More specifically, the present inventive concepts relate to semiconductor devices including a crack detection structure.

2. Description of the Related Art

Generally, a semiconductor integrated circuit is formed in a wafer of semiconductor material in a repeated pattern. The wafer is sawed into a large number of individual semiconductor devices, and the sawed semiconductor devices are packaged to semiconductor chips, respectively. During execution of the sawing and packaging processes, crack may be generated in the semiconductor device. It is desired to precisely detect the crack and prevent the shipment of defective products.

SUMMARY

An aspect of the present inventive concepts provides a semiconductor device including a semiconductor structure for detecting whether a crack has penetrated.

Another aspect of the present inventive concepts provides a semiconductor device including a semiconductor structure which is configured to detect whether a crack has penetrated, and has improved detection power.

According to some example embodiments of the present inventive concepts, a semiconductor device includes a substrate including a central region and a peripheral region surrounding the central region, a semiconductor integrated circuit in the central region, and a three-dimensional crack detection structure in the peripheral region, the three-dimensional crack detection structure surrounding the central region, the three-dimensional crack detection structure including a first pattern, a second pattern, and a third pattern, the first and second patterns extending in a first direction and spaced apart from each other, the third pattern being parallel to an upper surface of the substrate and connecting the first and second patterns to each other, the third pattern including a first portion and a second portion, the first and second portions extending in a second direction and a third direction respectively, the second direction intersecting with the first direction, the third direction intersecting with the first and second directions.

According to some example embodiments of the present inventive concepts, a semiconductor device includes a substrate including a first region and a second region surrounding the first region, a first semiconductor structure in the first region, and a second semiconductor structure in the second region, the second semiconductor structure including a crack detection structure (CDS), the CDS including a net type pattern both ends of which are connected to a first input terminal and a first output terminal, respectively, the net type pattern including a plurality of vertical patterns parallel to each other, a plurality of upper patterns connecting upper portions of the plurality of vertical patterns, and a plurality of lower patterns connecting lower portions of the plurality of vertical patterns, a length of each of the plurality of upper patterns being smaller than a length of each of the plurality of lower patterns.

According to some example embodiments of the present inventive concepts, a semiconductor device includes a substrate including a central region and a peripheral region surrounding the central region, a semiconductor integrated circuit in the central region, and a three-dimensional crack detection structure in the peripheral region and surrounding the central region, the three-dimensional crack detection structure including a first vertical pattern and a second vertical pattern, the first and second vertical patterns spaced apart from each other and extending in a first direction, the first and second vertical patterns being along a first line surrounding the central region, a horizontal pattern connecting the first and second vertical patterns to each other, the horizontal pattern being parallel to an upper surface of the substrate, at least a part of the horizontal pattern being outside the first line.

The aspects of the inventive concepts are not limited to those mentioned above and other aspects not specifically mentioned herein below can be clearly understood by those skilled in the art from the description below.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
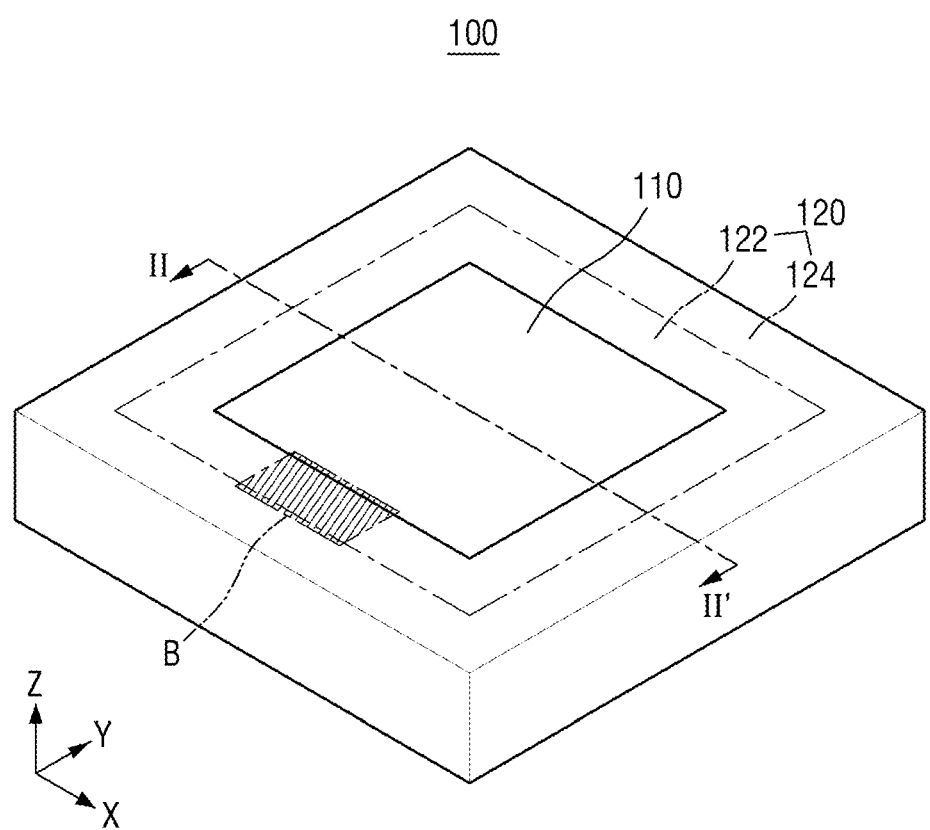
FIG. 1 is a perspective view illustrating a semiconductor device according to an example embodiment.
Figure 2:
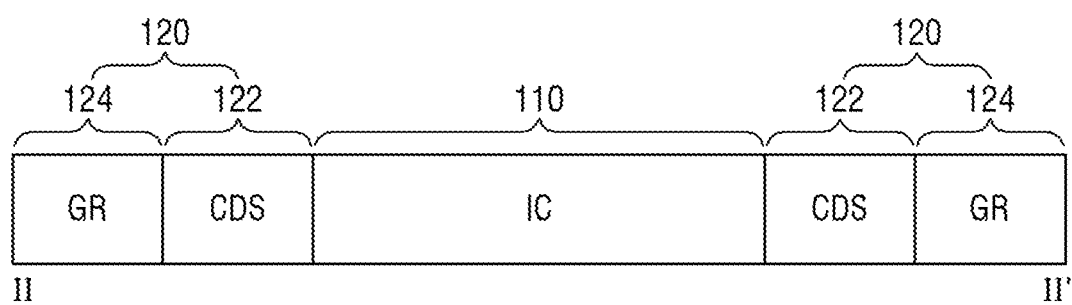
FIG. 2 is a cross-sectional view taken along line II-II' of FIG. 1.
Figure 2:
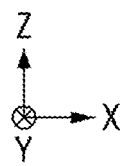

FIG. 1 is a perspective view illustrating a semiconductor device according to an example embodiment. FIG. 2 is a cross-sectional view taken along line II-II' of FIG. 1.

Referring to FIGS. 1 and 2, a semiconductor device 100 according to an example embodiment may include a central region 110 and a peripheral region 120. The peripheral region 120 of the semiconductor device 100 may surround the central region 110.

According to some example embodiments, a semiconductor integrated circuit (IC) may be formed in the central region 110. The semiconductor integrated circuit (IC) may be a semiconductor structure configured to perform a main function(s) of the semiconductor device 100. For example, the semiconductor device 100 may be a memory device. For example, the semiconductor integrated circuit (IC) may be a memory integrated circuit which includes, for example, a memory cell array, a column decoder, and a row decoder. However, example embodiments are not limited thereto. For example, in some example embodiments, the semiconductor device 100 may be a Central Processing Unit (CPU).

According to some example embodiments, the peripheral region 120 may include a crack detection region 122 and a crack protection region 124. The crack detection region 122 may include a crack detection structure (CDS). For example, the crack detection structure (CDS) may be formed in a three-dimensional (3D) space.

In some example embodiments, the crack prevention region 124 may include a crack prevention structure (GR). For example, the crack prevention structure (GR) may be a guard ring. The crack prevention structure (GR) will be described in detail with reference to FIG. 3.

Figure 3:
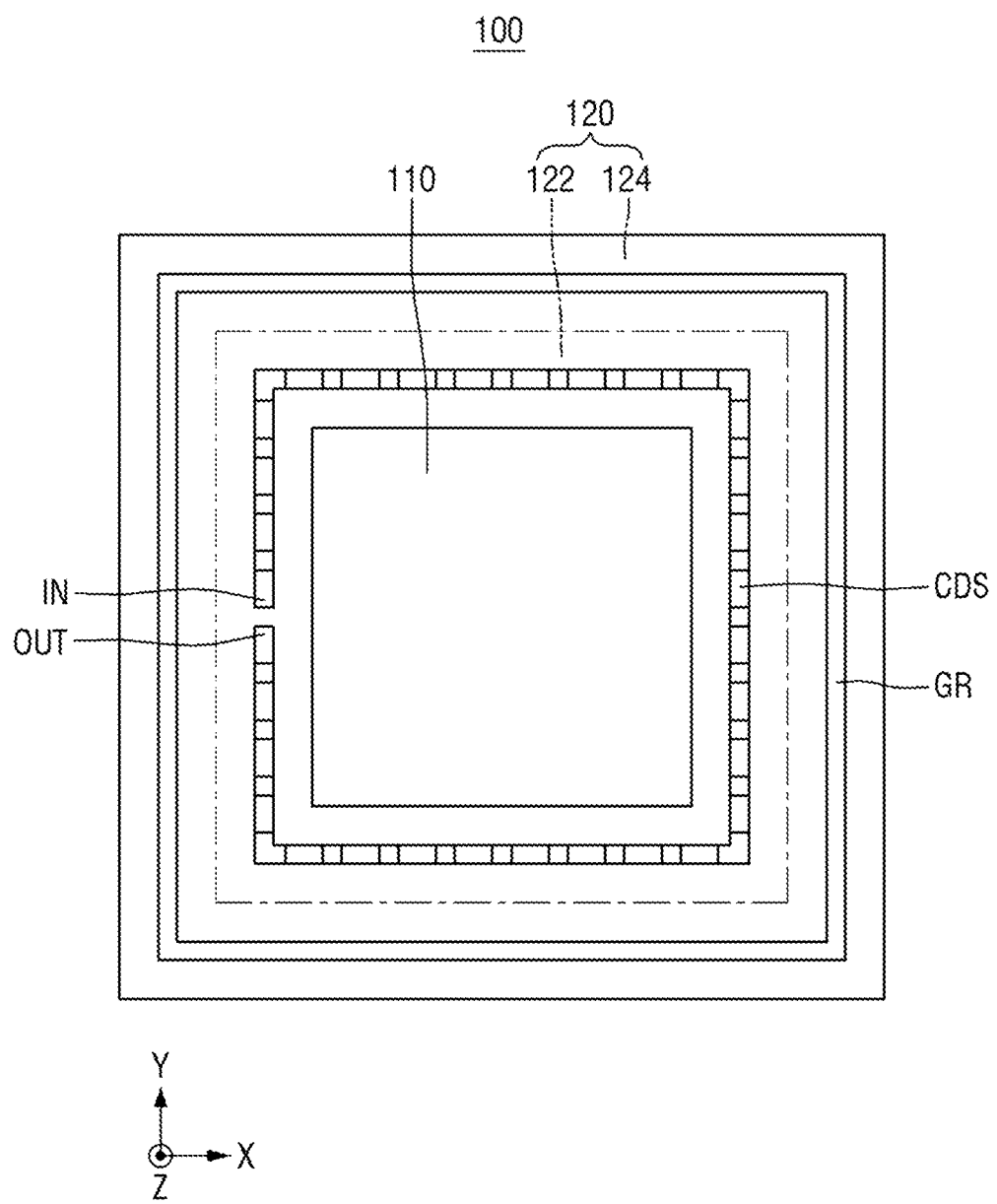
FIG. 3 is a plan view of the semiconductor device of FIG. 1 as viewed from a Z direction.

FIG. 3 is a plan view of the semiconductor device of FIG. 1 as viewed from a Z direction.

Referring to FIG. 3, the crack detection structure (CDS) according to an example embodiment may be formed in the crack detection region 122. In a plan view, the crack detection structure (CDS) may be formed in a ring shape which is sawed along the crack detection region 122 (e.g., which is cut at one position). For example, the crack detection structure (CDS) may be formed to surround the central region 110 of the semiconductor device 100 from an input terminal (IN) to an output terminal (OUT). In some example embodiments, both ends of the crack detection structure (CDS) may be separated from each other. Both ends of the crack detection structure (CDS) may include the input terminal (IN) and the output terminal (OUT). In some example embodiments, a tester to be described later may be connected to the input terminal (IN) and the output terminal (OUT).

In some example embodiments, the crack prevention structure (GR) may be formed in the crack protection region 124. The crack prevention structure (GR) may be formed in a ring shape along the crack protection region 124. For example, the crack prevention structure (GR) may be formed to surround the crack detection structure (CDS). Both ends of the crack prevention structure (GR) may be connected. Unlike the crack detection structure (CDS), the crack prevention structure (GR) may not include input/output terminals. The crack prevention structure (GR) will be described in detail with reference to FIG. 4.

Figure 4:
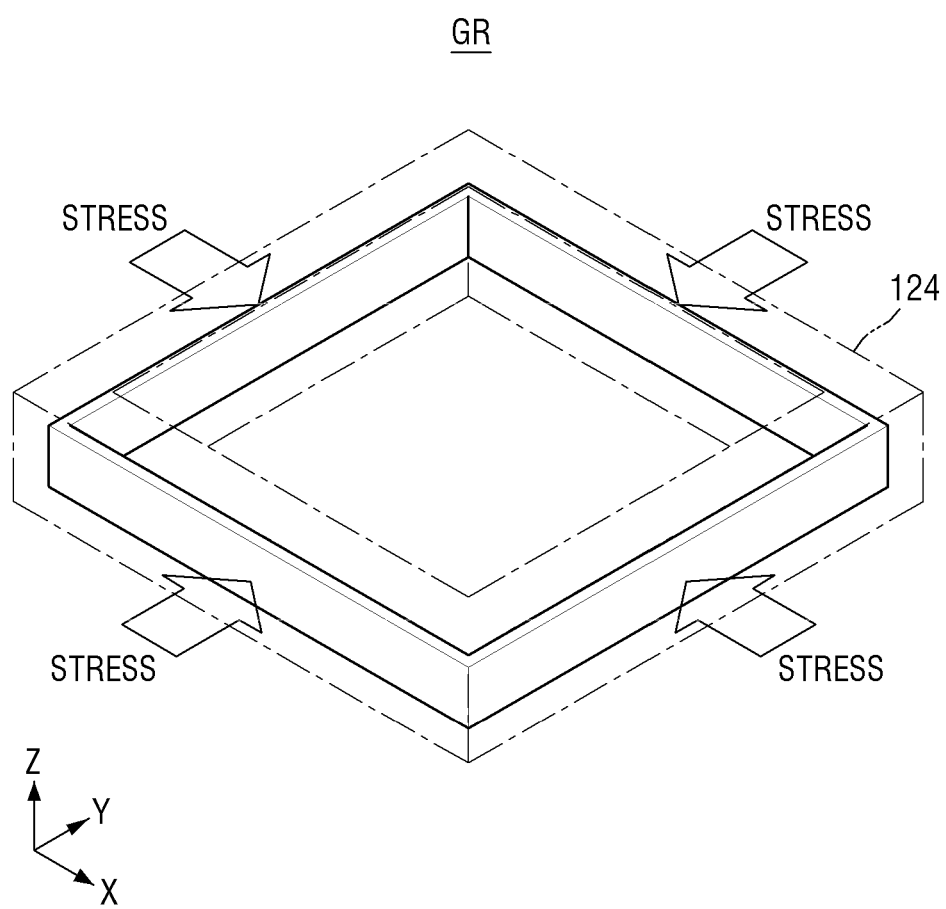
FIG. 4 is a perspective view illustrating a crack prevention structure according to an example embodiment.

FIG. 4 is a perspective view illustrating a crack prevention structure according to an example embodiment. FIG. 4 illustrates only the crack prevention structure (GR) among the constituent elements of the semiconductor device 100.

The semiconductor integrated circuit (IC) and the crack detection structure (CDS) may be disposed inside the crack prevention structure (GR). For example, the crack prevention structure (GR) may surround the semiconductor integrated circuit (IC) and the crack detection structure (CDS).

In some example embodiments, the semiconductor device 100 may be formed by sawing the wafer and packaging the wafer. For example, when sawing the wafer, physical stress (STRESS) may be applied toward the interior of the semiconductor device 100 from the outside of the semiconductor device 100. At this time, the crack prevention structure (GR) may partially block the physical stress (STRESS) transmitted from the outside. For example, the crack prevention structure (GR) may block the stress (STRESS) from the outside to prevent crack from being formed. Physical stress (STRESS) generated in a process of sawing the wafer is an illustrative example, and example embodiments are not limited thereto. For example, the physical stress (STRESS) may also be generated by a packaging process.

In some example embodiments, if the crack prevention structure (GR) fails to block the physical stress (STRESS), a crack may be formed. The formed crack may permeate toward the crack detection region 122 from the outside. The crack detection structure (CDS) may detect crack penetrating into the crack detection region 122. The crack detection structure (CDS) will be more specifically described with reference to FIG. 5.

Figure 5:
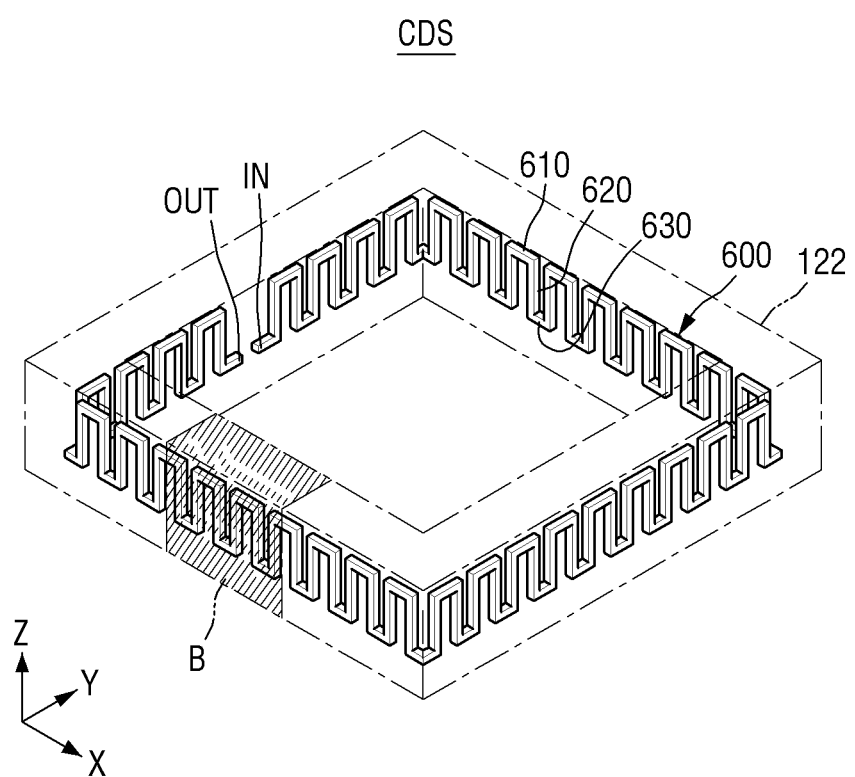
FIG. 5 is a perspective view illustrating a crack detection structure according to an example embodiment.

FIG. 5 is a perspective view illustrating a crack detection structure according to an example embodiment. FIG. 5 illustrates only the crack detection structure (CDS) among the constituent elements of the semiconductor device 100.

Referring to FIG. 5, the semiconductor integrated circuit (IC) may be disposed inside the crack detection structure (CDS). Further, the crack prevention structure (GR) may be disposed outside the crack detection structure (CDS). For example, the crack detection structure (CDS) may surround the semiconductor integrated circuit (IC). Further, the crack detection structure (CDS) may be disposed between the crack prevention structure (GR) and the semiconductor integrated circuit (ID).

In some example embodiments, as illustrated in FIG. 5, the crack detection structure (CDS) may be formed in a net type pattern 600. In some example embodiments, the net type pattern 600 may include a plurality of upper horizontal patterns 610, a plurality of vertical patterns 620, and a plurality of lower horizontal patterns 630.

As illustrated in FIG. 5, a pattern in which the plurality of upper horizontal patterns 610, the plurality of vertical patterns 620, and the plurality of lower horizontal patterns 630 are continuously disposed in the form of pi ($\pi$) of Greek letters is referred to as a net type pattern 600.

In some example embodiments, the plurality of vertical patterns 620 may be spaced apart from one another, and may be formed to extend in a first direction (e.g., Z direction). The plurality of upper horizontal patterns 610 may be formed to be spaced apart from each other and may be formed to extend in a second direction (e.g., X direction) or a third direction (e.g., Y direction) intersecting with the first direction.

In some example embodiments, the plurality of vertical patterns 620 may be connected to each other by the plurality of upper horizontal patterns 610 and the plurality of lower horizontal patterns 630. In some example embodiments, the plurality of upper horizontal patterns 610 and the plurality of lower horizontal patterns 630 may alternately connect the plurality of vertical patterns 620. For example, the two vertical patterns 620 may be connected to each other by the upper horizontal pattern 610. Further, the vertical patterns 620 connected to each other by the upper horizontal pattern 610 may be connected to another adjacent vertical pattern 620 by the lower horizontal pattern 630. For example, the net type pattern 600 may be formed by repeatedly connecting the vertical pattern 620, the upper horizontal pattern 610, the vertical pattern 620, and the lower horizontal pattern 630 in order.

In some example embodiments, the input terminal (IN) and the output terminal (OUT) may be disposed at both ends of the net type pattern 600. The net type pattern 600 may have a shape that surrounds the central region (110 of FIG. 1), by setting the input terminal (IN) as a starting point and setting the output terminal (OUT) as an ending point. For example, the crack detection structure (CDS) may be formed to surround the semiconductor integrated circuit (IC), by setting the input terminal (IN) and the output terminal (OUT) as both ends. Hereinafter, in order to explain the crack detection structure (CDS) in more detail, a description will be given mainly on a partial region B of the crack detection structure (CDS).

Figure 6:
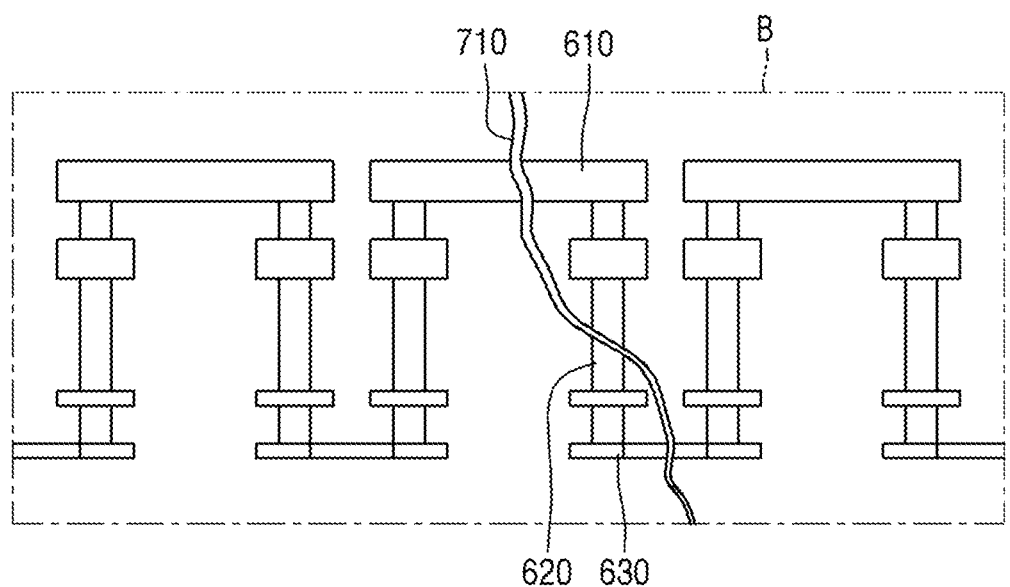
FIG. 6 is a diagram illustrating a state in which a crack generated from the outside penetrates into the interior of the crack detection structure in accordance with an example embodiment.
Figure 7:
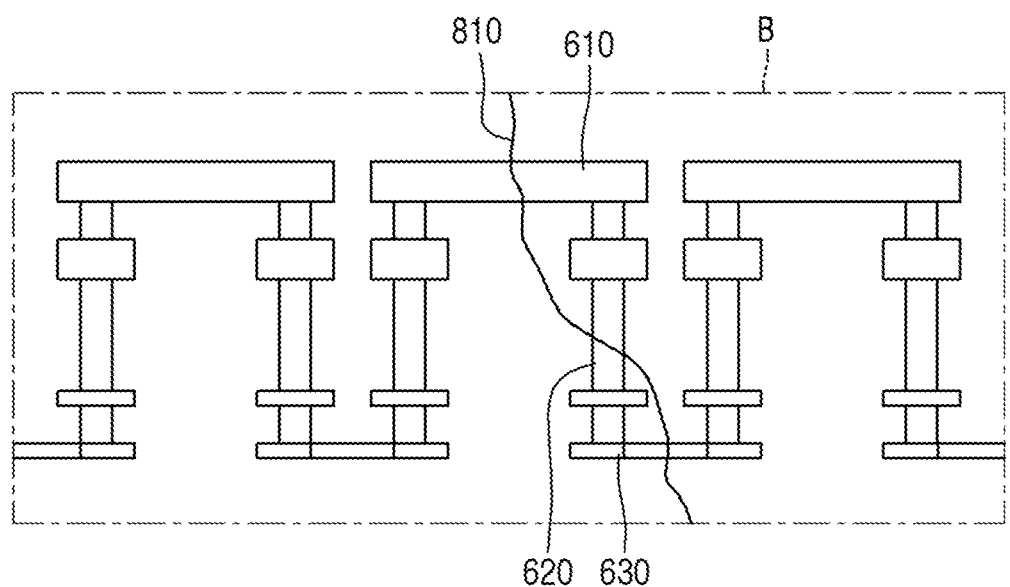
FIG. 7 is a diagram illustrating a state in which a nano crack generated from the outside penetrates into the crack detection structure in accordance with an example embodiment.
Figure 7:
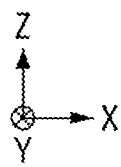
Figure 8:
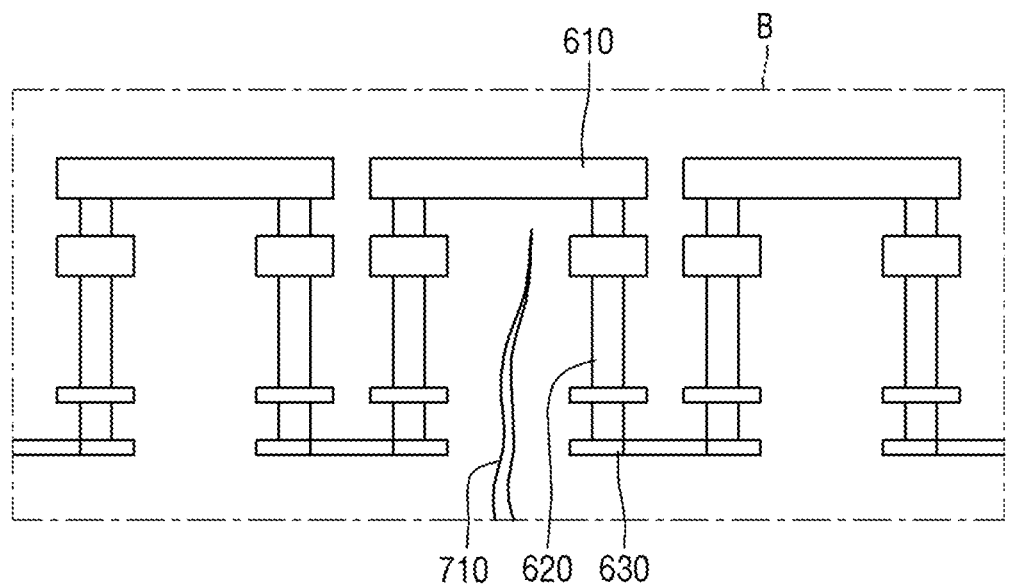
FIG. 8 is a diagram illustrating a crack penetrating in a particular direction in the crack detection structure (CDS) according to an example embodiment.

FIG. 6 is a diagram illustrating a state in which a crack generated from the outside penetrates into the interior of the crack detection structure in accordance with an example embodiment. FIG. 7 is a diagram illustrating a state in which a nano crack generated from the outside penetrates into the crack detection structure in accordance with an example embodiment. FIG. 8 is a diagram illustrating a crack penetrating in a particular direction in the crack detection structure (CDS) according to an example embodiment. FIGS. 6 to 8 illustrate only a specific region B of the crack detection structure (CDS) separately for convenience of explanation. Also, FIGS. 6 to 8 are cross-sectional views illustrating a specific region B for convenience of explanation. The crack and nano crack illustrated in FIGS. 6 to 8 are illustrated at specific positions, specific directions, specific angles, and specific sizes. However, these are only examples thereof, and example embodiments of course are not limited to thereto.

FIG. 6 illustrates a case where crack 710 generated from the outside penetrates into the crack detection structure (CDS). Referring to FIG. 6, when the crack 710 generated from the outside penetrates into the upper horizontal pattern 610, at least a part of the upper horizontal pattern 610 may be destroyed. For example, the magnitude of energy generated at the time of forming the crack 710 may be greater than the magnitude of energy for destroying the upper horizontal pattern 610. In some example embodiments, the energy generated at the time of forming the crack 710 may be transmitted to the upper horizontal pattern 610. At this time, at least a part of the upper horizontal pattern 610 may be destroyed. In some example embodiments, when at least a part of the upper horizontal pattern 610 is destroyed, the output current provided to the tester may be delayed or may not flow. For example, when the output current is delayed or does not flow, it is determined that a crack is generated in the semiconductor device 100. A specific description of a method for detecting a crack will be described later.

Similarly, when the crack 710 generated from the outside penetrates into the vertical pattern 620, at least a part of the vertical pattern 620 may be destroyed. For example, the magnitude of energy generated at the time of formation of the crack 710 may be greater than the magnitude of energy for destroying the vertical pattern 620. In some example embodiments, the energy generated at the time of formation of the crack 710 may be transmitted to the vertical pattern 620. At this time, at least a part of the vertical pattern 620 may be destroyed. In some example embodiments, when at least a part of the vertical pattern 620 is destroyed, the output current provided to the tester may be delayed or may not flow. A specific explanation thereof will be provided later Likewise, when the crack 710 generated from the outside penetrates into the lower horizontal pattern 630, at least a part of the lower horizontal pattern 630 may be destroyed. For example, the magnitude of the energy generated at the time of formation of the crack 710 may be greater than the magnitude of the energy for destroying the lower horizontal pattern 630. In some example embodiments, the energy generated at the time of formation of the crack 710 may be transmitted to the lower horizontal pattern 630. At this time, at least a part of the lower horizontal pattern 630 may be destroyed. In some example embodiments, when at least a part of the lower horizontal pattern 630 is destroyed, the output current provided to the tester may be delayed or may not flow. A specific description thereof will be provided later.

FIG. 7 illustrates a case where a nano crack 810 generated from the outside penetrates into the crack detection structure (CDS). In some example embodiments, the nano crack 810 may be a finer crack than the crack 710 described in FIG. 6. The finer crack may mean a crack having a relatively small energy generated at the time of formation of the crack. For example, the energy generated when the nano crack 810 is formed can be smaller than the energy generated when the crack 710 is formed. In some example embodiments, the upper horizontal pattern 610 and the vertical pattern 620 may not be destroyed even when the nano crack 810 permeates. For example, the magnitude of the energy generated at the time of forming the nano crack 810 may be smaller than the magnitude of the energy for destroying the upper horizontal pattern 610 and the vertical pattern 620. Therefore, even if the nano crack 810 is formed from the outside toward the upper horizontal pattern 610 and the vertical pattern 620, the upper horizontal pattern 610 and the vertical pattern 620 may not be destroyed.

For example, the material for forming the upper horizontal pattern 610 and the vertical pattern 620 may be a material having a relatively high ductility. Because the upper horizontal pattern 610 and the vertical pattern 620 has relatively highly ductile, even if though the nano crack 810 penetrates, the upper horizontal pattern 610 and the vertical pattern 620 may not be destroyed.

Also, for example, the upper horizontal pattern 610 and the vertical pattern 620 may be relatively thick. Because the upper horizontal pattern 610 and the vertical pattern 620 are relatively thick, even if the nano crack 810 penetrates, the upper horizontal pattern 610 and the vertical pattern 620 may not be destroyed.

In some example embodiments, if the nano crack 810 penetrates, the lower horizontal pattern 630 may be destroyed. For example, the magnitude of the energy generated at the time of forming the nano crack 810 may be greater than the magnitude of the energy for destroying the lower horizontal pattern 630. Therefore, when the nano crack 810 generated from the outside is formed in the lower horizontal pattern 630, the lower horizontal pattern 630 may be destroyed.

For example, the material forming the lower horizontal pattern 630 may be a material having a relatively high brittleness. Because the lower horizontal pattern 630 has the relatively high brittle, the lower horizontal pattern 630 may be destroyed when the nano crack 810 penetrates.

Also, for example, the lower horizontal pattern 630 may be relatively thin. Because the lower horizontal pattern 630 is relatively thin, the lower horizontal pattern 630 may be destroyed when the nano crack 810 penetrates.

Referring to FIG. 8, when the generated crack 710 is formed in a specific direction, the upper horizontal pattern 610, the vertical pattern 620, and the lower horizontal pattern 630 of the crack detection structure (CDS) may not be destroyed. For example, when the generated crack 710 penetrates between the vertical patterns 620 without passing through the upper horizontal pattern 610, the upper horizontal pattern 610, the vertical pattern 620, and the lower horizontal pattern 630 may not be destroyed. At this time, although the crack is actually generated in the semiconductor device 100, there may be no change in the structure of the crack detection structure (CDS).

In some example embodiments, "destruction" of the upper horizontal pattern 610, the vertical pattern 620 and/or the lower horizontal pattern 630 means that the upper horizontal pattern 610, the vertical pattern 620 and/or the lower horizontal pattern 630 are electrically opened.

In some example embodiments, "partial destruction" of the upper horizontal pattern 610, the vertical pattern 620 and/or the lower horizontal pattern 630 means that the upper horizontal pattern 610, the vertical pattern 620 and/or the lower horizontal pattern 630 are electrically connected to each other, but there is a change in the resistances of the upper horizontal pattern 610, the vertical pattern 620 and/or the lower horizontal pattern 630. In some example embodiments, when the upper horizontal pattern 610, the vertical pattern 620 and/or the lower horizontal pattern 630 are "partially destroyed," the delay time of the current passing through the crack detection structure (CDS) may increase.

In some example embodiments, "non-destruction" of the upper horizontal pattern 610, the vertical pattern 620, and/or the lower horizontal pattern 630 means that the upper horizontal pattern 610, the vertical pattern 620 and/or the lower horizontal pattern 630 are not electrically opened. If the upper horizontal pattern 610, the vertical pattern 620 and/or the lower horizontal pattern 630 are physically partially destroyed, but they are electrically connected to each other, they may be described as "not being destroyed" in this specification.

As it will be described later, when using the crack detection method according to some example embodiments, only when the crack 710 or the nano crack 810 may be detected only when at least a part of the upper horizontal pattern 610, the vertical pattern 620, and/or the lower horizontal pattern 630 is destroyed.

In some example embodiments, when a nano crack 810 is generated but the nano crack 810 does not penetrate the lower horizontal pattern 630, it is possible to determine that the crack is not generated, even when the crack detection method to be described later is used. That is, although the crack is actually generated, and thus the semiconductor device 100 is defective the semiconductor device 100 can be designated as a non-defective device in the case that the generated crack is only the nano crack 810.

In some other example embodiments, although the crack 710 is generated, when the crack 710 penetrates in a specific direction, it is possible to determine that no crack is generated even if the crack detection method to be described later is used. That is, even though the crack actually is generated, and thus the semiconductor device 100 is defective, the semiconductor device 100 may be designated as a non-defective device in the case that the generated crack 710 penetrates into the interior of the semiconductor device 100 in a specific direction.

Finally, the semiconductor device 100 including the crack detection structure (CDS) according to some example embodiments may be provided to the market in spite of a defect. Hereinafter, a semiconductor device including a crack detection structure which has enhanced crack detection power will be described according to some example embodiments.

FIGS. 9, 10, 11, and 12 are cross-sectional views for illustrating crack detection structures (CDS) according to some example embodiments. FIGS. 9 to 12 illustrate only cross-sectional views of a specific region B of the crack detection structure (CDS) for convenience of explanation. Further, repeated contents of FIGS. 9 to 12 will be omitted or briefly explained.

Figure 9:
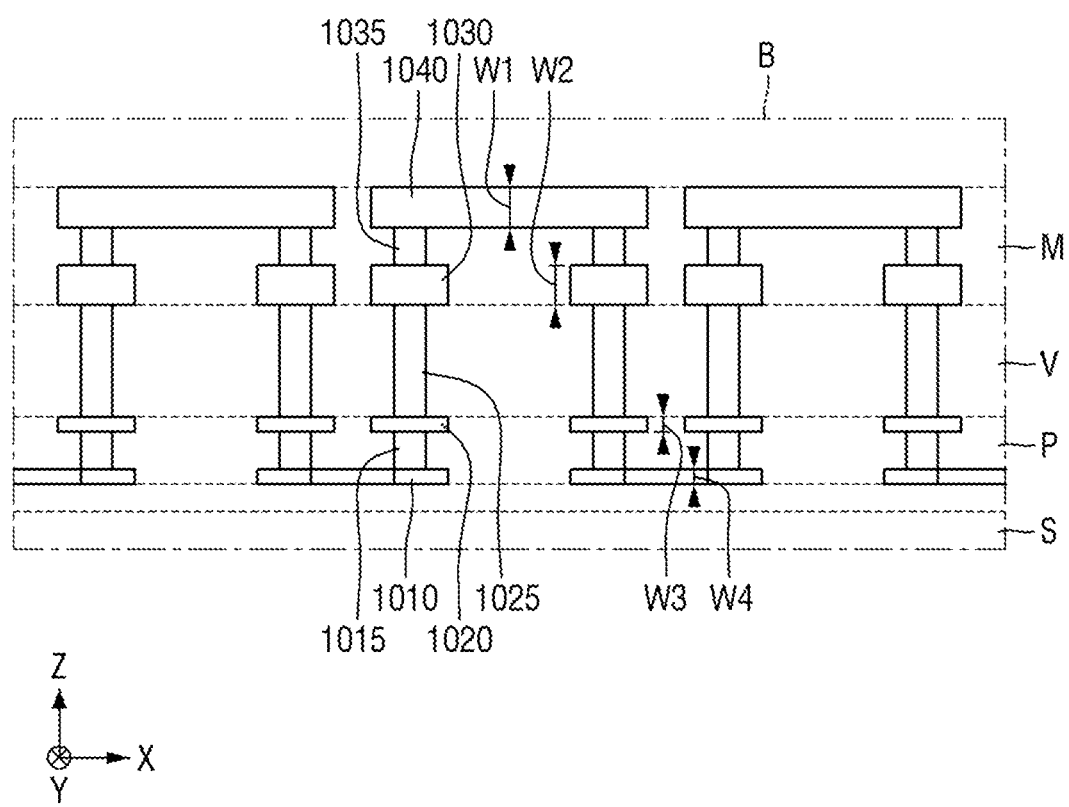
FIGS. 9, 10, 11, and 12 are cross-sectional views for illustrating crack detection structures (CDS) according to some example embodiments.

Referring to FIG. 9, the crack detection structure (CDS) may include a first poly pattern 1010, a second poly pattern 1020, a first metal pattern 1030, a second metal pattern 1040, and first to third vertical contacts 1015, 1025, and 1035. The term "poly" may indicate "poly-crystal material". In some example embodiments, the first poly pattern 1010, the second poly pattern 1020, the first metal pattern 1030, the second metal pattern 1040, and first to third vertical contacts 1015, 1025, and 1035 may be formed of a conductive material. For example, the first and second poly pattern 1010, 1020 may be formed of tungsten (W), but the present inventive concepts are not limited thereto.

In some example embodiments, a poly layer region P may be disposed on the substrate S. In some example embodiments, a via region V may be located on the poly layer region P. In some example embodiments, a metal layer region M may be disposed on the via region V. However, example embodiments are not limited thereto. For example, the via region V may be arranged in the substrate S and the poly layer region P may be arranged below the substrate S.

In some example embodiments, the first poly pattern 1010 and the second poly pattern 1020 may be formed in the poly layer region P. The second poly pattern 1020 may be formed on the first poly pattern 1010. The first poly pattern 1010 and the second poly pattern 1020 may be connected to each other by a first vertical contact 1015.

Figure 10:
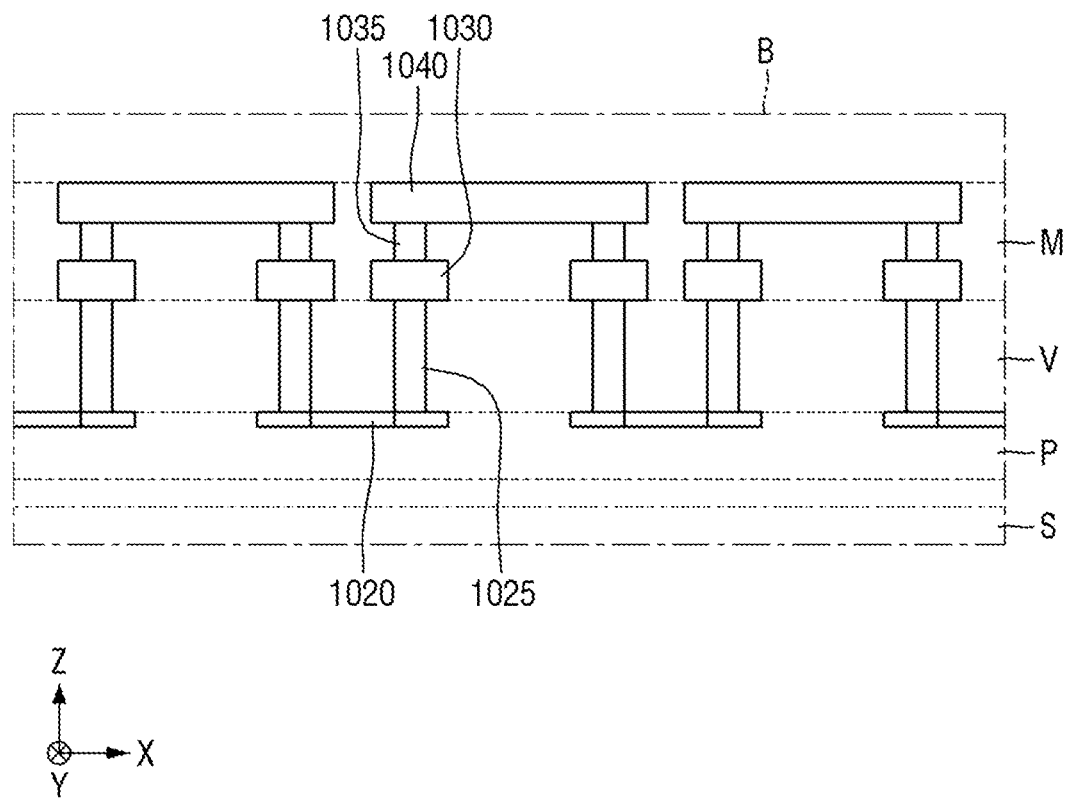

For example, the first poly pattern 1010 may correspond to the gate poly layer included in the semiconductor integrated circuit (IC) of the central region (110 of FIG. 1). For example, the second poly pattern 1020 may correspond to a bit line poly layer included in the semiconductor integrated circuit (IC) of the central region (110 of FIG. 1). FIG. 10 illustrates a cross-sectional view of the crack detection structure (CDS), and the first poly pattern 1010 is illustrated as a straight line (-), but the example embodiments are not limited thereto. A specific explanation will be provided later.

In some example embodiments, the first metal pattern 1030 and the second metal pattern 1040 may be formed in the metal layer region M. The second metal pattern 1040 may be formed on the first metal pattern 1030. The first metal pattern 1030 and the second metal pattern 1040 may be connected to each other by a third vertical contact 1035. For example, the first metal pattern 1030 and the second metal pattern 1040 may correspond to the metal wiring layer included in the semiconductor integrated circuit (IC) of the central region (110 of FIG. 1).

In some example embodiments, the second vertical contact 1025 may be formed in the via region V. The second vertical contact 1025 may connect the first metal pattern 1030 of the metal layer region M and the second poly pattern 1020.

In some example embodiments, a thickness W2 of the first metal pattern 1030 and a thickness W1 of the second metal pattern 1040 may be relatively thicker than a thickness W4 of the first poly pattern and a thickness W3 of the second poly pattern 1020. In other words, the first poly pattern 1010 and the second poly pattern 1020 may be formed to be relatively thinner than the first metal pattern 1030 and the second metal pattern 1040.

In some example embodiments, the upper horizontal pattern (610 of FIG. 5) may correspond to the second metal pattern 1040. In some example embodiments, the vertical pattern (620 of FIG. 5) may correspond to the first to third vertical contacts 1015, 1025, and 1035, the first metal pattern 1030, and the second poly pattern 1020. In some example embodiments, the lower horizontal pattern (630 of FIG. 5) may correspond to the first poly pattern 1010.

Referring to FIG. 10, in some example embodiments, the crack detection structure (CDS) may include a second poly pattern 1020, a first metal pattern 1030, a second metal pattern 1040, and second and third vertical contact 1025 and 1035. For example, according to some example embodiments, the first poly pattern 1010 and the first vertical contact 1015 may be omitted in the crack detection structure (CDS) of FIG. 10.

In some example embodiments, the upper horizontal pattern (610 of FIG. 5) may correspond to the second metal pattern 1040. In some example embodiments, the vertical pattern (620 of FIG. 5) may correspond to the second and third vertical contacts 1025 and 1035 and the first metal pattern 1030. In some example embodiments, the lower horizontal pattern (630 of FIG. 5) may correspond to the second poly pattern 1020. FIG. 10 illustrates a front view of the crack detection structure (CDS), and the second poly pattern 1020 is illustrated as being formed as a straight line (-), but example embodiments are not limited thereto. A specific explanation will be given later.

Figure 11:
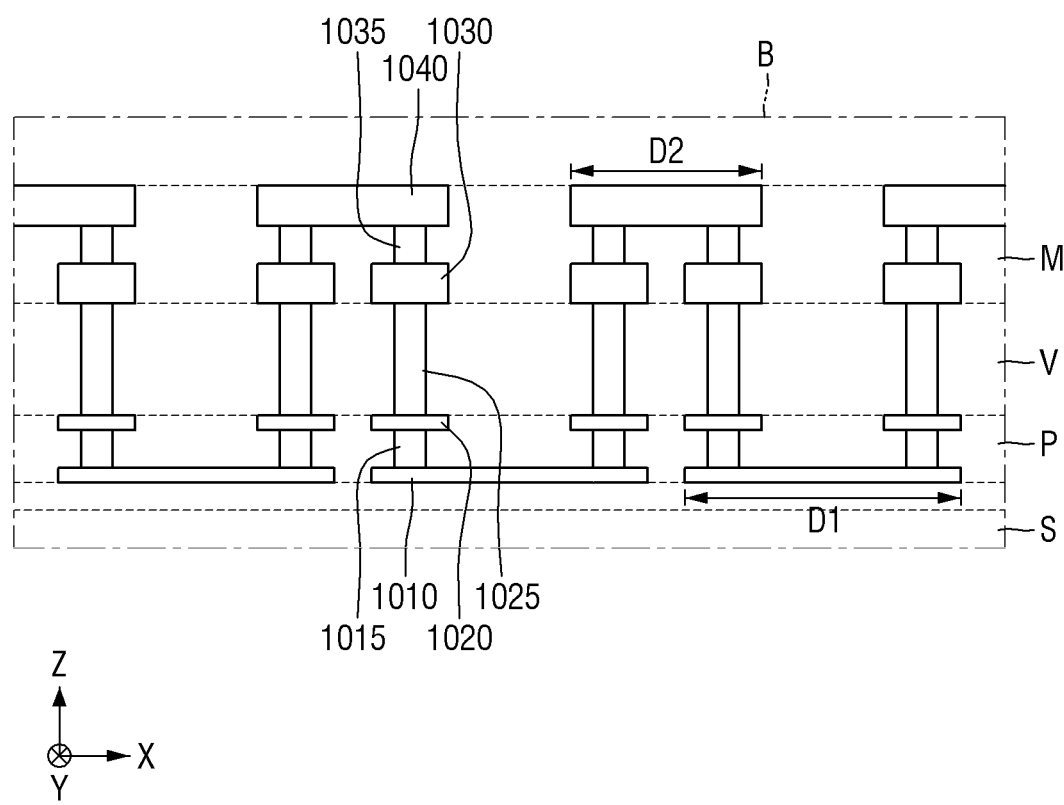

Referring to FIG. 11, in some example embodiments, the crack detection structure (CDS) may include a first poly pattern 1010, a second poly pattern 1020, a first metal pattern 1030, a second metal pattern 1040, and first to third vertical contacts 1015, 1025, and 1035.

In some example embodiments, a length D1 of the first poly pattern 1010 may be longer than a length D2 of the second metal pattern 1040. Although FIG. 11 illustrates the length D1 of the first poly pattern 1010 as the shortest distance between both ending points of the first poly pattern 1010, the length of the first poly pattern 1010 means the length of the path in which the first poly pattern 1010 is formed.

Figure 12:
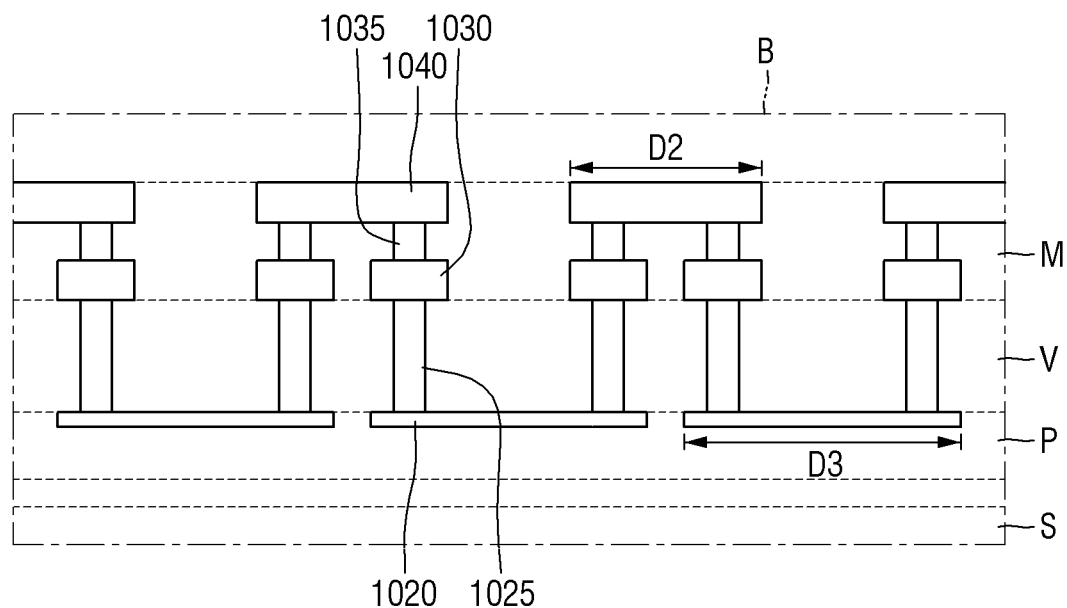

Referring to FIG. 12, in some example embodiments, the crack detection structure (CDS) may include a second poly pattern 1020, a first metal pattern 1030, a second metal pattern 1040, and second and third vertical contacts 1025 and 1035. For example, according to some example embodiments, the first poly pattern 1010 and the first vertical contact 1015 may be omitted in the crack detection structure (CDS) of FIG. 11.

In some example embodiments, a length D3 of the second poly pattern 1020 may be longer than a length D2 of the second metal pattern 1040. Although FIG. 12 illustrates the length D3 of the second poly pattern 1020 as the shortest distance formed both ending points of the second poly pattern 1020, the length of the second poly pattern 1020 means the length of the path in which the second poly pattern 1020 is formed.

The configurations of the upper horizontal pattern 610, the vertical pattern 620, and the lower horizontal pattern 630 of the crack detection structure (CDS) according to some example embodiments have been described above with reference to FIGS. 9 to 12, but example embodiments are not limited thereto. In some other example embodiments, other patterns (not illustrated) may be further formed in each region. For example, another metal pattern may be formed between the first and second metal patterns 1030 and 1040.

In some other example embodiments, each constituent element may be omitted. For example, in some example embodiments, the first metal pattern 1030 may be omitted. Also, example embodiments are not limited to the positions at which the respective constituent elements are illustrated. For example, the via region V may be arranged in the substrate S. Those having ordinary skill in the technical field of the present inventive concepts will be able to combine various example embodiments by combining several example embodiments disclosed in this specification or through a simple design change.

Figure 13:
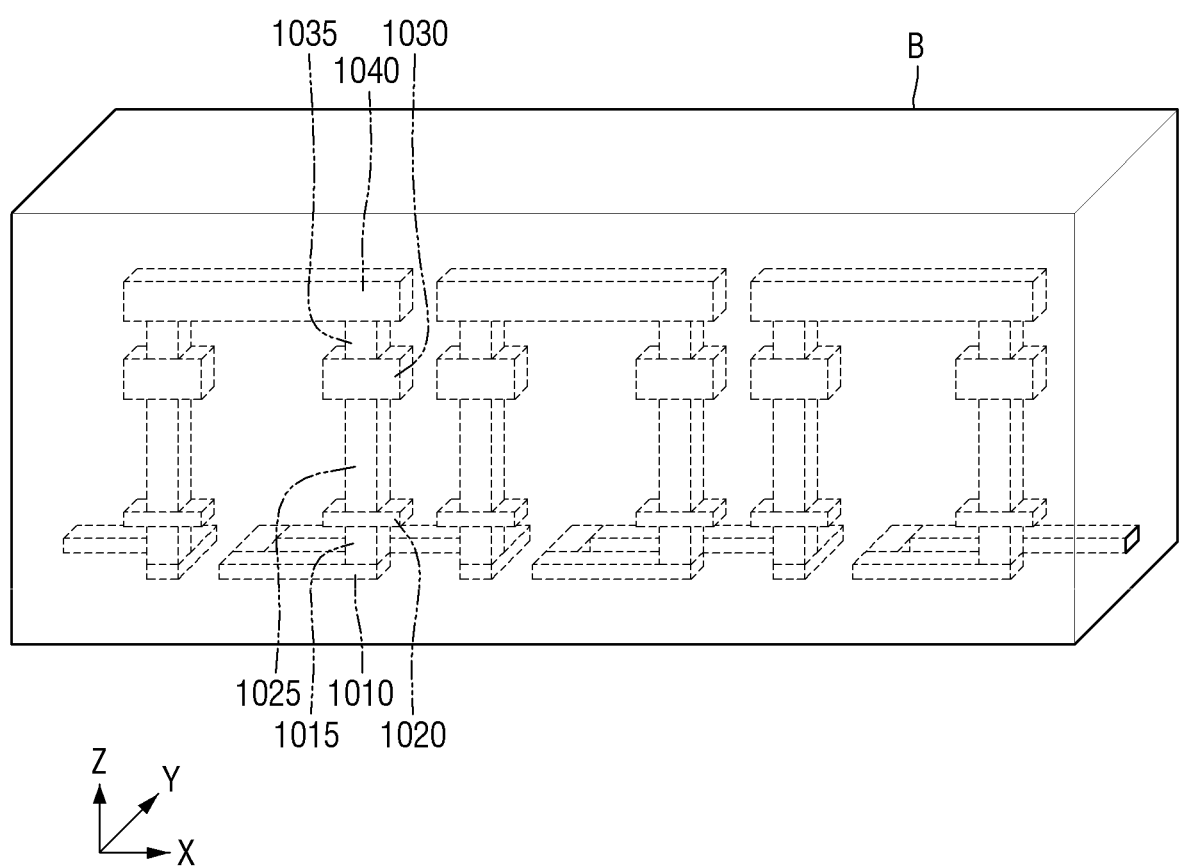
FIG. 13 is a perspective view illustrating a crack detection structure according to an example embodiment.

FIG. 13 is a perspective view illustrating a crack detection structure according to an example embodiment. FIGS. 14A, 14B, 14C, 14D, 14E, and 14F are diagrams for illustrating the shape of the lower horizontal pattern according to some example embodiments. Hereinafter, repeated contents will be omitted or briefly explained for convenience of explanation.

Referring to FIGS. 5 and 13, the first poly pattern 1010 may correspond to the lower horizontal pattern 630. In some example embodiments, all the lower horizontal patterns 630 may be formed in a snake pattern. In this specification, the snake pattern means a single line which connects two points, except for a straight line which connects two points at the shortest distance. That is, the snake pattern is a line that connects two points and does not diverge, and may all the lines that directly connect the two points. For illustrative explanation, reference is made to FIGS. 14a to 14f.

FIGS. 14A to 14F illustrate a snake pattern according to some example embodiments. That is to say, the pattern illustrated in FIGS. 14A to 14F may have a shape of the first poly pattern 1010. For example, the first poly pattern 1010 illustrated in FIG. 13 may have the shape of the snake pattern illustrated in FIG. 14A.

Figure 14A:
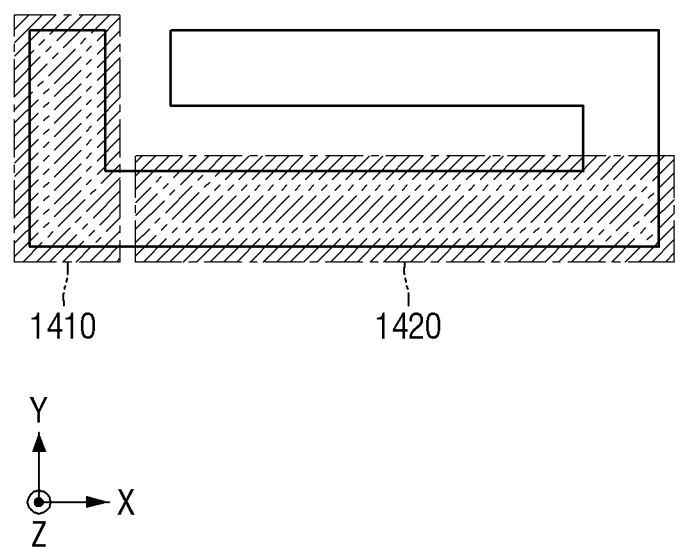
FIGS. 14A, 14B, 14C, 14D, 14E, and 14F are diagrams for illustrating the shapes of a lower horizontal pattern according to some example embodiments.

Referring to FIG. 14A, the snake pattern may include a first portion 1410 extending in a first direction (e.g., a Y direction), and a second portion 1420 extending in a second direction (e.g., X direction) intersecting with the first direction.

Figure 14B:
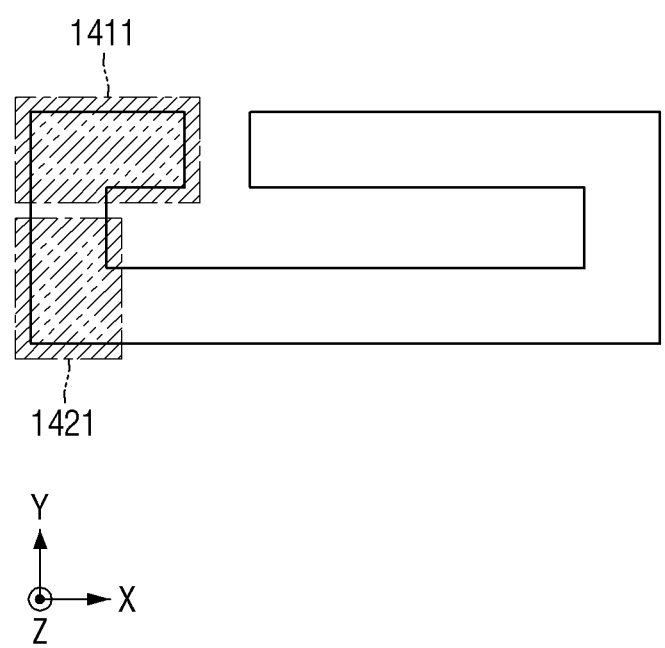

Referring to FIG. 14B, the snake pattern may include a first portion 1411 extending in the first direction (e.g., the X direction), and the second portion 1421 extending in a second direction (e.g., the Y direction) intersecting with the first direction.

Figure 14C:
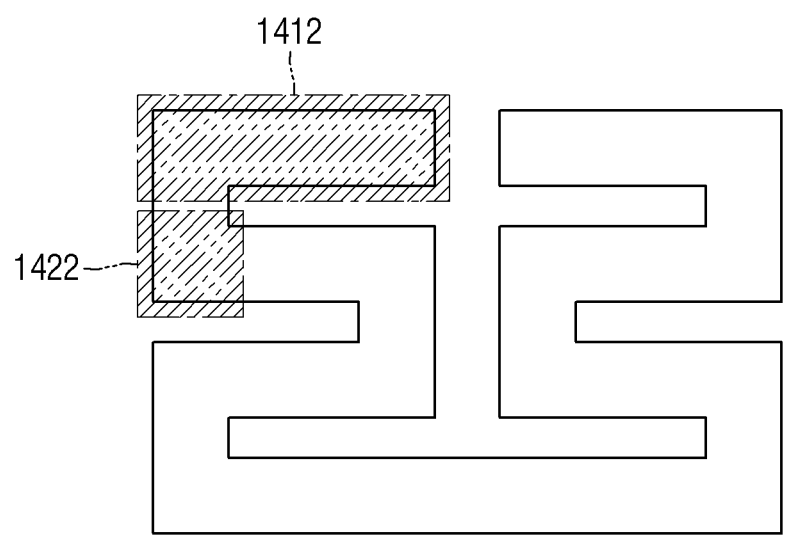
Figure 14C:
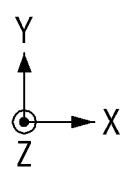

Referring to FIG. 14C, the snake pattern may include a first portion 1412 extending in the first direction (e.g., X direction), and a second portion 1422 extending in the second direction (e.g., Y direction) intersecting with the first direction.

Figure 14D:
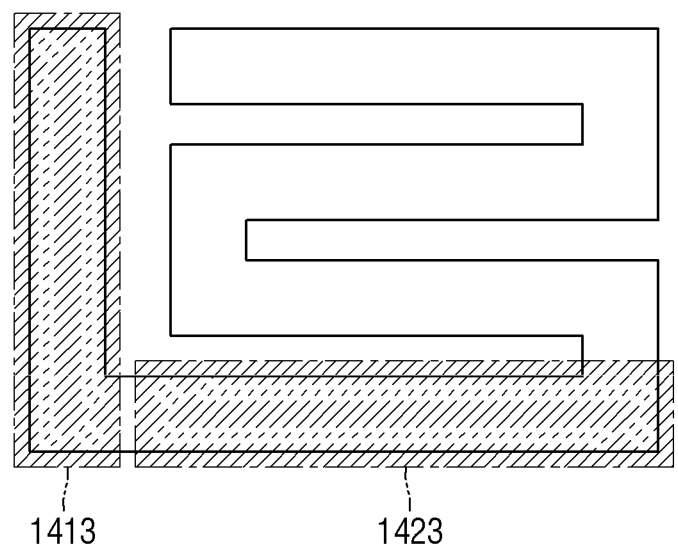

Referring to FIG. 14D, the snake pattern may include a first portion 1413 extending in the first direction (e.g., Y direction), and a second portion 1423 extending in the second direction (e.g., X direction) intersecting with the first direction.

Figure 14E:
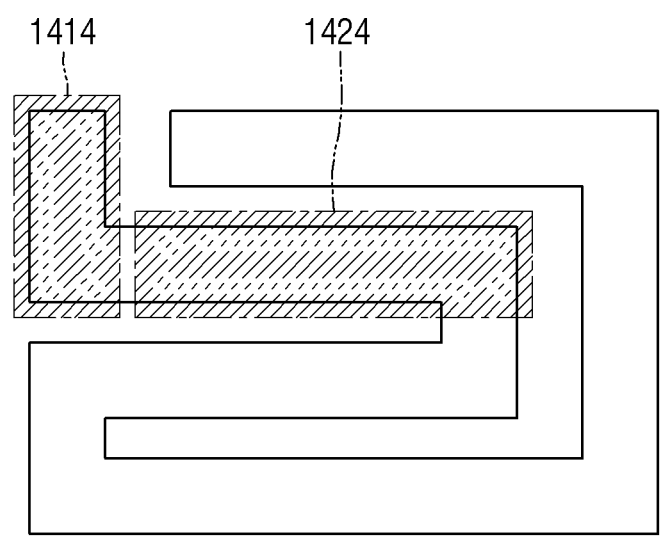

Referring to FIG. 14E, the snake pattern may include a first portion 1414 extending in the first direction (e.g., Y direction), and a second portion 1424 extending in the second direction (e.g., X direction) intersecting with the first direction.

Figure 14F:
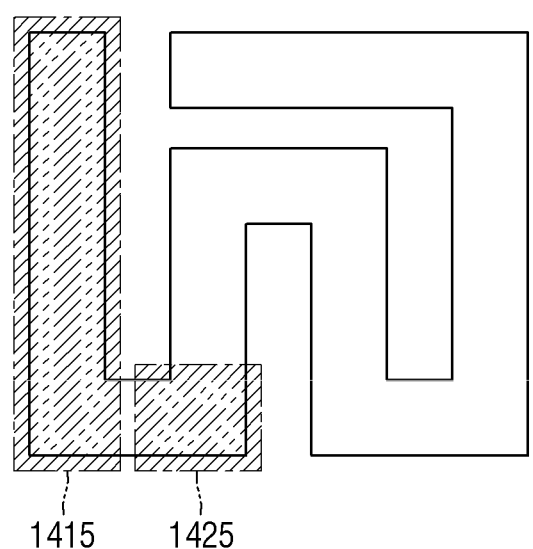

Referring to FIG. 14F, the snake pattern may include a first portion 1415 extending in the first direction (e.g., Y direction), and a second portion 1425 extending in the second direction (e.g., X direction) intersecting with the first direction.

For example, the snake pattern may be a single line which extends in multiple directions and does not diverge to other lines.

Although FIGS. 14A to 14F illustrate various forms of the snake pattern, these are merely example for the convenience of explanation, and example embodiments are not limited thereto.

Figure 15:
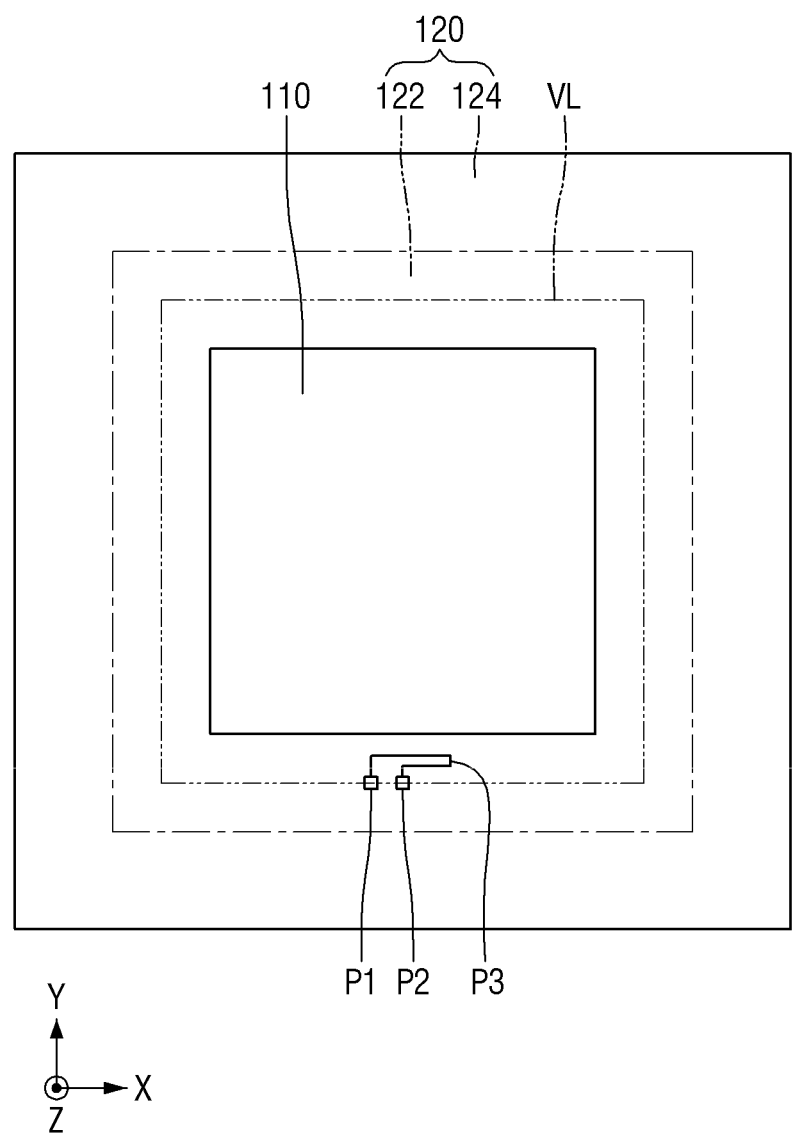
FIG. 15 is a plan view for illustrating a connection relation between a vertical pattern and a lower horizontal pattern according to an example embodiment.

FIG. 15 is a plan view for illustrating a connection relation between a vertical pattern and a lower horizontal pattern according to an example embodiment.

Referring to FIG. 15, the shape of the lower horizontal pattern (630 of FIG. 5) will be further described. As described above, the crack detection structure (CDS) may be arranged in the crack detection region 122. The vertical pattern (620 of FIG. 5) of the crack detection structure (CDS) may be arranged along the vertical pattern arrangement line VL. The vertical pattern arrangement line VL is a virtual line set for convenience of explanation.

For example, the first vertical pattern P1 and the second vertical pattern P2 may be arranged along the vertical pattern arrangement line VL. The first vertical pattern P1 and the second vertical pattern P2 may be connected by the first lower horizontal pattern P3. In some example embodiments, at least a part of the first lower horizontal pattern P3 may be formed outside the vertical pattern arrangement line VL. For example, the first lower horizontal pattern P3 connects the first vertical pattern P1 and the second vertical pattern P2, but may not follow the vertical pattern arrangement line VL. For example, the first lower horizontal pattern P3 may not be a line connecting the first vertical pattern P1 and the second vertical pattern P2 in the shortest distance. For example, the first lower horizontal pattern P3 may connect the first vertical pattern P1 and the second vertical pattern P2, using a snake pattern.

Although FIG. 15 illustrates a configuration in which the first lower horizontal pattern P3 is arranged inside (that is, close to the central region 110) the first vertical pattern P1 and the second vertical pattern P2. However, example embodiments are not limited thereto. As described in FIGS. 14A to 14F, the lower horizontal pattern (630 of FIG. 5) may be formed in various patterns.

Figure 16:
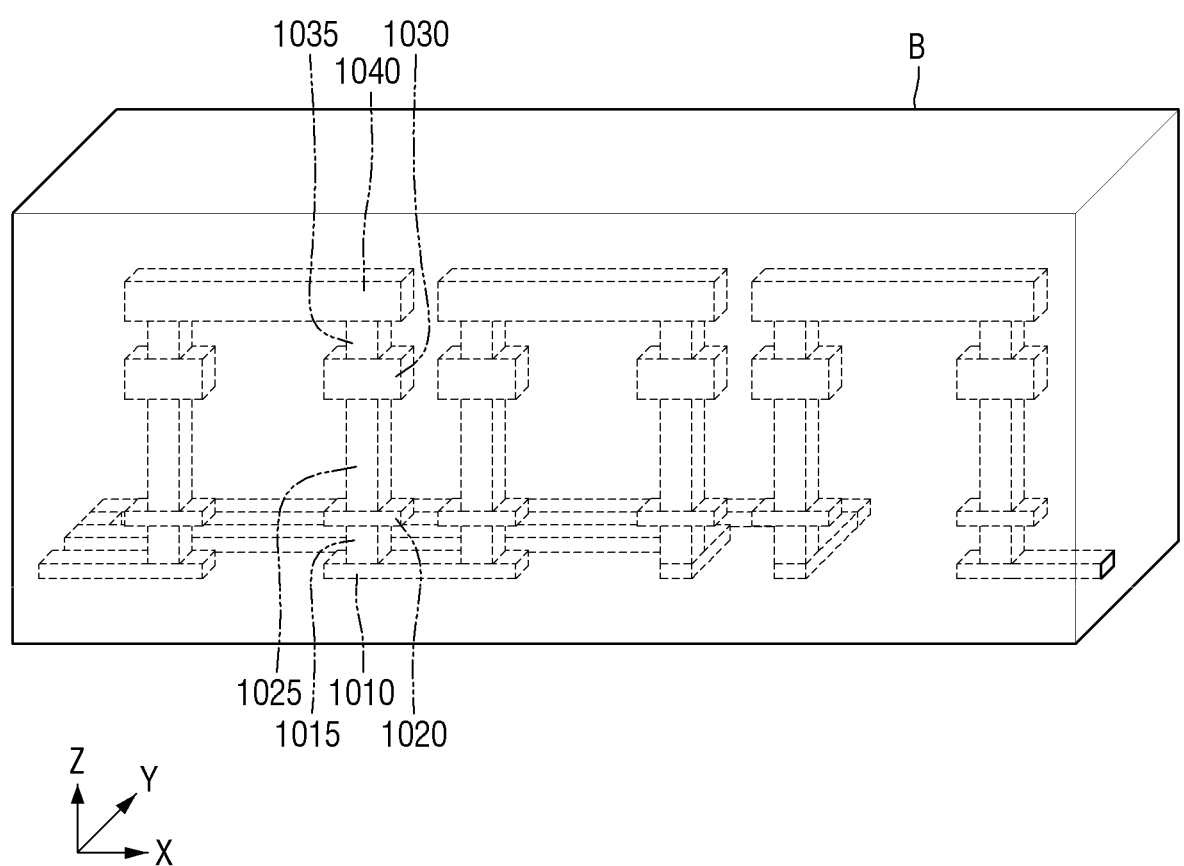
FIGS. 16, 17, and 18 are perspective views for illustrating crack detection structures according to some other example embodiments.
Figure 17:
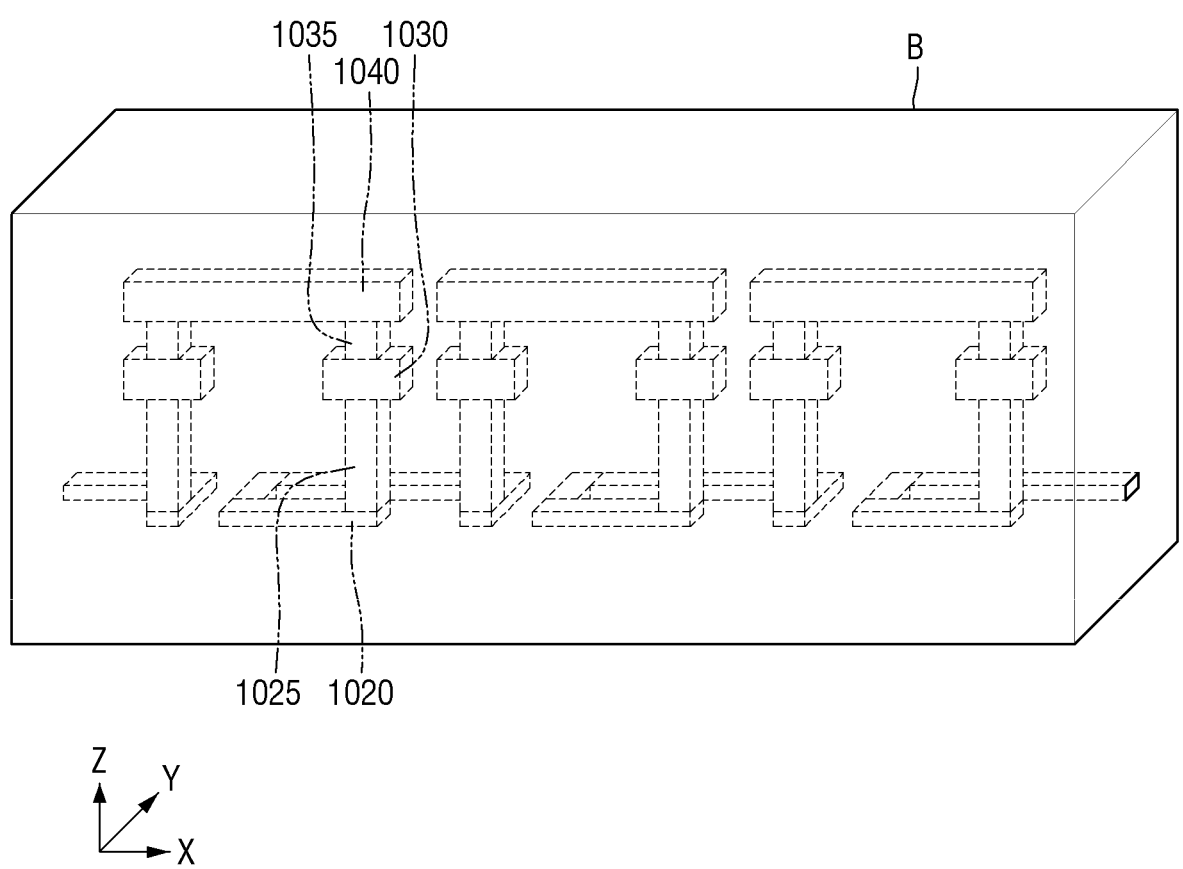
Figure 18:
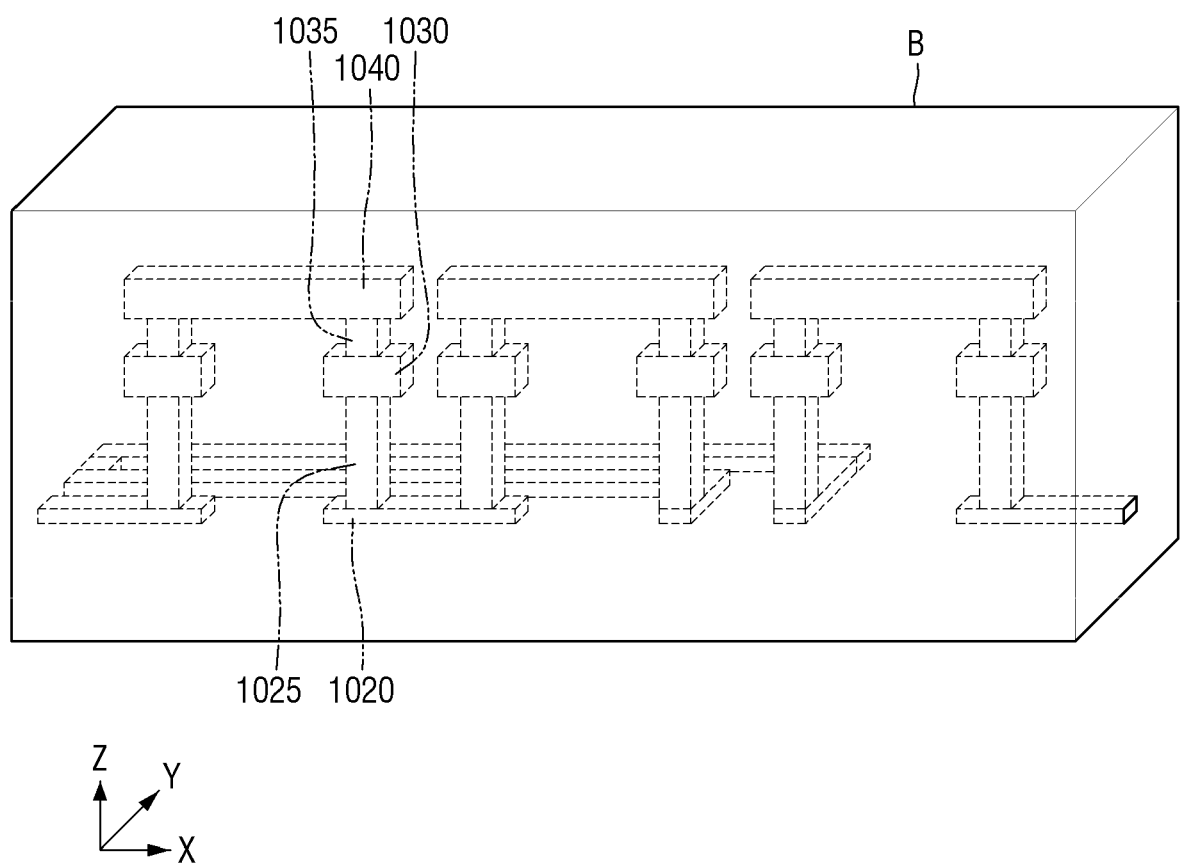

FIGS. 16, 17, and 18 are perspective views for illustrating crack detection structures according to some other example embodiments.

Referring to FIGS. 5 and 16, the first poly pattern 1010 may correspond to the lower horizontal pattern 630. In some example embodiments, a part of the lower horizontal pattern 630 may be formed in a snake pattern. As illustrated in FIG. 16, a part of the first poly pattern 1010 may connect the first vertical contacts 1015 to each other at the shortest distance. For example, a part of the first poly pattern 1010 may connect the first vertical contact 1015 in a straight line (-) pattern. Another part of the first poly pattern 1010 may connect the first vertical contacts 1015 in a snake pattern.

Referring to FIGS. 5 and 17, the second poly pattern 1020 may correspond to the lower horizontal pattern 630. In some example embodiments, all the lower horizontal patterns 630 may be formed in a snake pattern.

Referring to FIGS. 5 and 18, the second poly pattern 1020 may correspond to the lower horizontal pattern 630. In some example embodiments, a part of the lower horizontal pattern 630 may be formed in a snake pattern.

Figure 19:
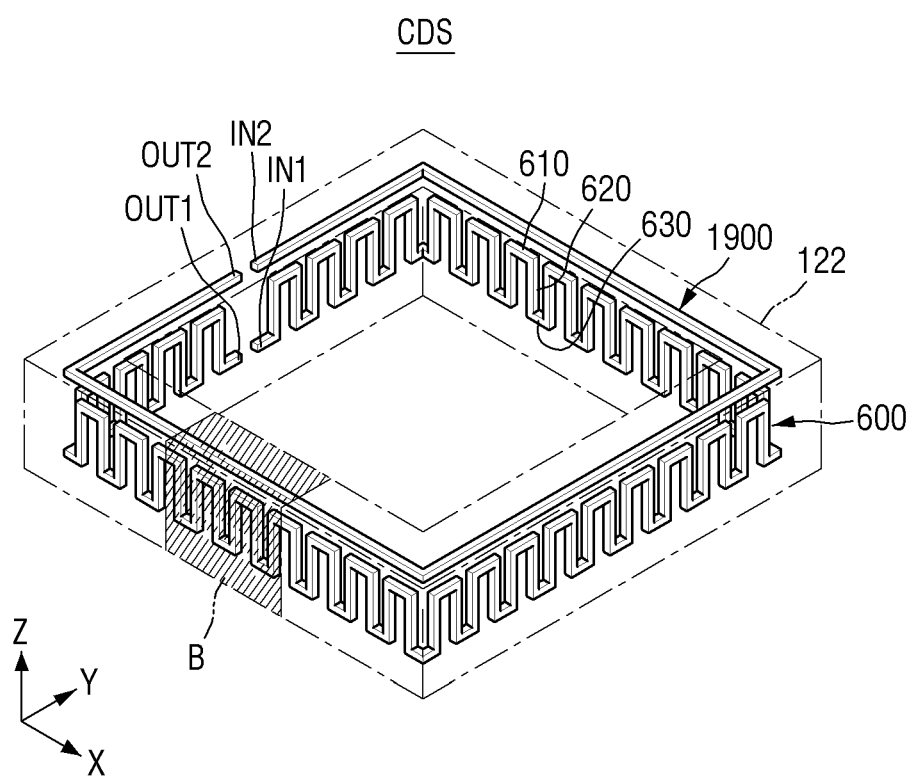
FIG. 19 is a perspective view illustrating a crack detection structure according to an example embodiment.

FIG. 19 is a perspective view illustrating a crack detection structure according to an example embodiment. FIG. 19 illustrates only the crack detection structure (CDS) among the constituent elements of the semiconductor device 100.

Referring to FIG. 19, a semiconductor integrated circuit (IC) may be disposed inside the crack detection structure (CDS). Further, a crack prevention structure (GR) may be disposed outside the crack detection structure (CDS). For example, the crack detection structure (CDS) may surround the semiconductor integrated circuit (IC). Further, the crack detection structure (CDS) may be between the crack prevention structure (GR) and the semiconductor integrated circuit (ID).

In some example embodiments, as illustrated in FIG. 19, the crack detection structure (CDS) may include a net type pattern 600 and a ring type pattern 1900.

In some example embodiments, both ends of the net type pattern 600 may include a first input terminal (IN1) and a first output terminal (OUT1). The net type pattern 600 may have a shape that surrounds the central region (110 of FIG. 1) with the first input terminal (IN1) as a starting point and the first output terminal (OUT1) as an ending point.

In some example embodiments, both ends of the ring type pattern 1900 may include a second input terminal (IN2) and a second output terminal (OUT2). The ring type pattern 1900 may have a shape that surrounds the central region (110 of FIG. 1) with the second input terminal (IN2) as a starting point and the second output terminal (OUT2) as an ending point.

For example, the crack detection structure (CDS) may include a net type pattern 600 having a first input terminal (IN1) and a first output terminal (OUT1) as both ends, and a ring type pattern 1900 having a second input terminal (IN2) and a second output terminal (OUT2) as both ends.

In some example embodiments, it is possible to further improve the detection power of crack generated in various directions, by including not only the net type pattern 600 but also the ring type pattern 1900 in the crack detection structure (CDS).

FIGS. 20, 21, 22, and 23 are cross-sectional views for illustrating crack detection structures (CDS) according to some example embodiments. FIGS. 20 to 23 illustrate only cross-sectional views of a specific region B of the crack detection structure (CDS) for convenience of explanation.

Figure 20:
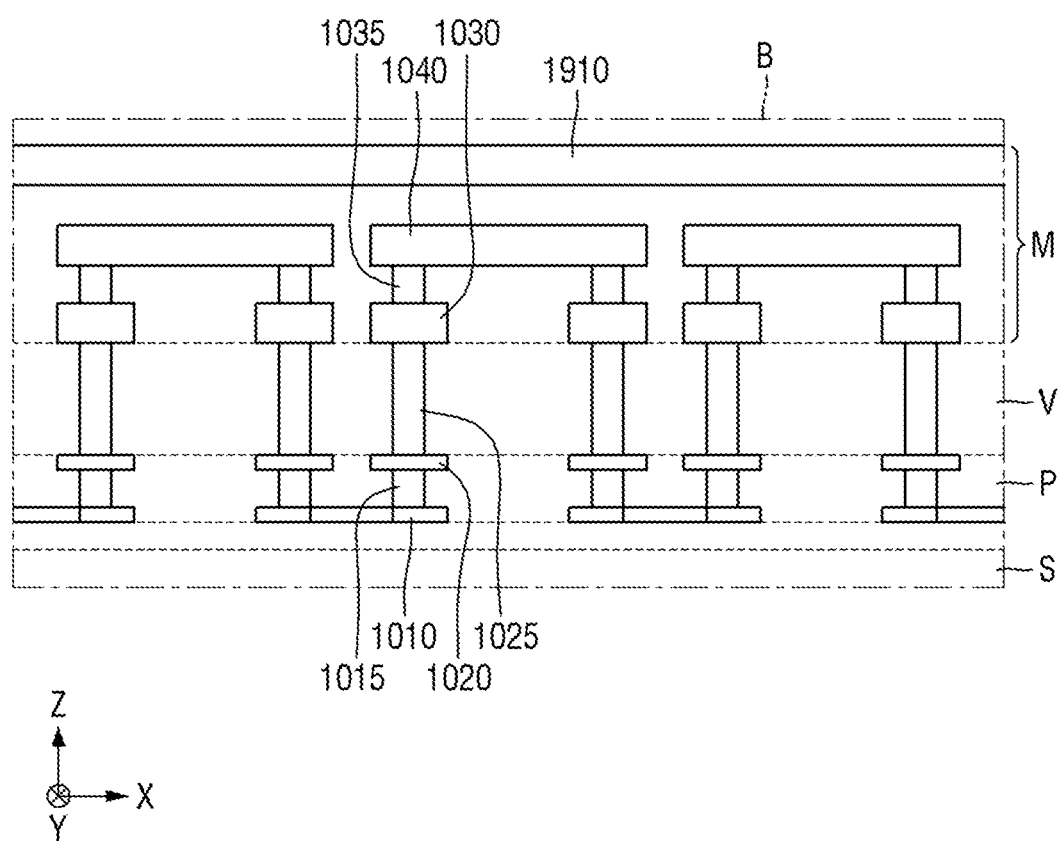
FIGS. 20, 21, 22, and 23 are cross-sectional views for illustrating crack detection structures (CDS) according to some example embodiments.

Referring to FIG. 20, the crack detection structure (CDS) according to some example embodiments may include a first poly pattern 1010, a second poly pattern 1020, a first metal pattern 1030, a second metal pattern 1040, a third metal pattern 1910, and first to third vertical contacts 1015, 1025, and 1035. That is to say, the crack detection structure (CDS) illustrated in FIG. 20 may include the third metal pattern 1910 in the crack detection structure (CDS) of FIG. 9.

In some example embodiments, the third metal pattern 1910 may be formed on the second metal pattern 1040 and within the metal layer region M. The third metal pattern 1910 may be formed along the crack detection region 122. For example, the third metal pattern 1910 may be within the crack detection region 122 in a shape that surrounds the central region 110. Both ends of the third metal pattern 1910 may be connected to the second input terminal (IN2) and the second output terminal (OUT2), respectively.

Figure 21:
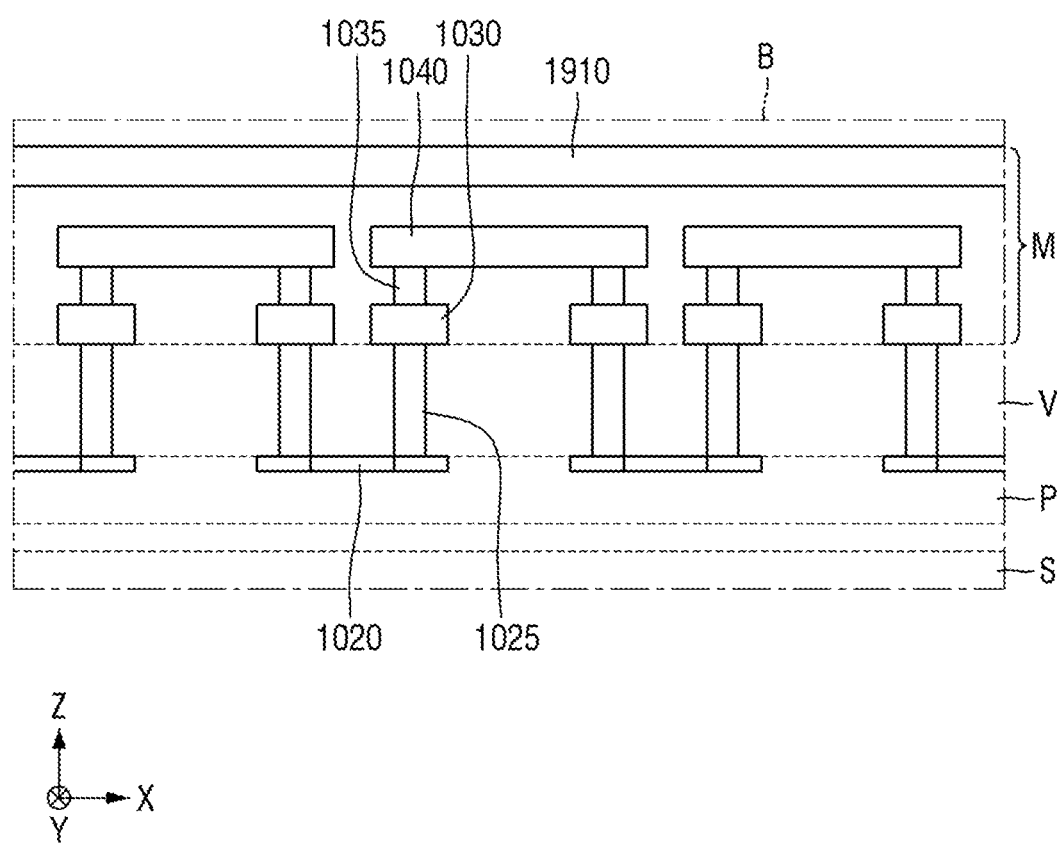

Referring to FIG. 21, the crack detection structure (CDS) according to some example embodiments may include a second poly pattern 1020, a first metal pattern 1030, a second metal pattern 1040, a third metal pattern 1910, and second and third vertical contacts 1025, and 1035. That is to say, the crack detection structure (CDS) illustrated in FIG. 21 may be configured to further include the third metal pattern 1910 in the crack detection structure (CDS) of FIG. 10.

Figure 22:
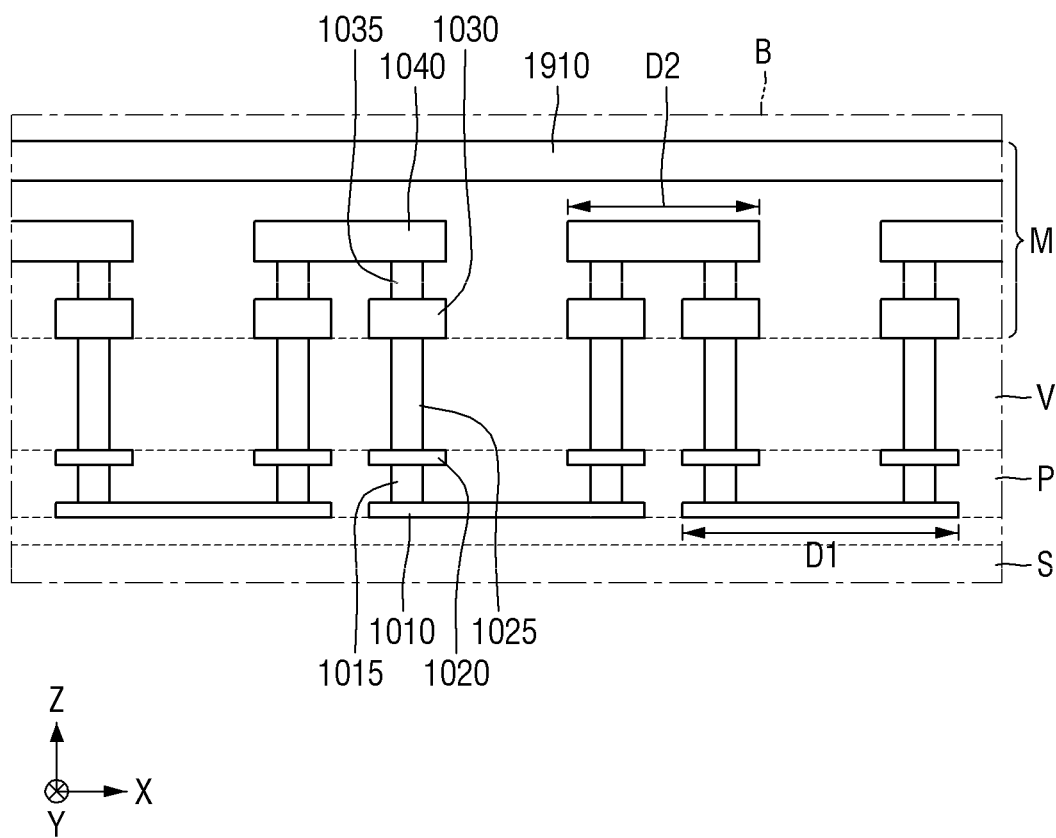

Referring to FIG. 22, the crack detection structure (CDS) according to some example embodiments may include a first poly pattern 1010, a second poly pattern 1020, a first metal pattern 1030, a second metal pattern 1040, a third metal pattern 1910, and first to third vertical contacts 1015, 1025, and 1035. That is to say, the crack detection structure (CDS) illustrated in FIG. 22 may be configured to further include the third metal pattern 1910 in the crack detection structure (CDS) of FIG. 11.

Figure 23:
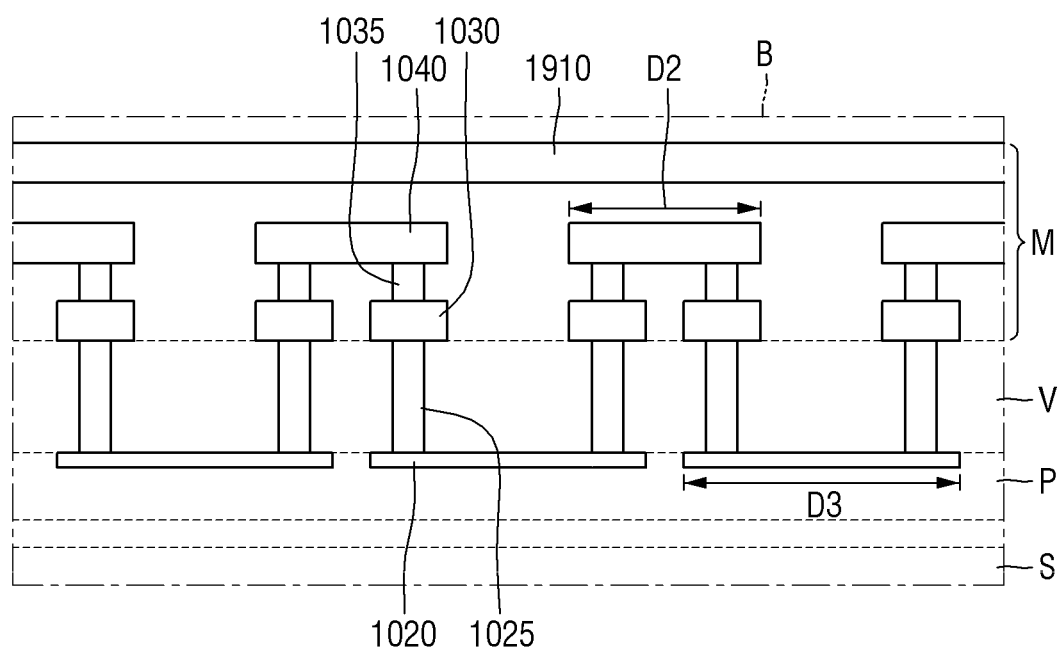

Referring to FIG. 23, the crack detection structure (CDS) according to some example embodiments may include a second poly pattern 1020, a first metal pattern 1030, a second metal pattern 1040, a third metal pattern 1910, and second and third vertical contacts 1025, and 1035. That is to say, the crack detection structure (CDS) illustrated in FIG. 23 may be configured to further include the third metal pattern 1910 in the crack detection structure (CDS) of FIG. 12.

FIGS. 24, 25, 26, and 27 are perspective views for illustrating crack detection structures according to some example embodiments.

Figure 24:
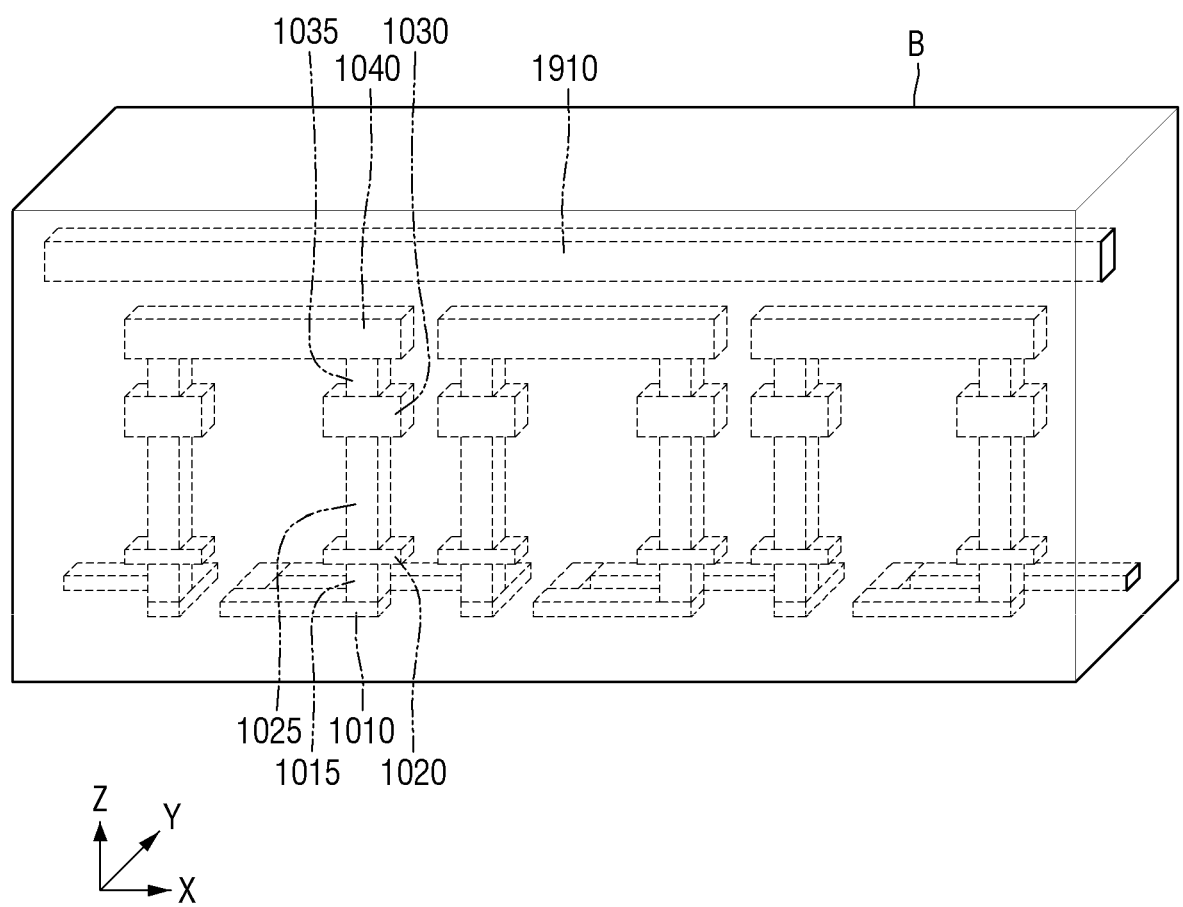
FIGS. 24, 25, 26, and 27 are perspective views for illustrating crack detection structures (CDS) according to some example embodiments.

Referring to FIG. 24, the crack detection structure (CDS) according to some example embodiments may include the third metal pattern 1910. The first poly pattern 1010 may correspond to the lower horizontal pattern 630. In some example embodiments, all the lower horizontal patterns 630 may be formed in a snake pattern.

Figure 25:
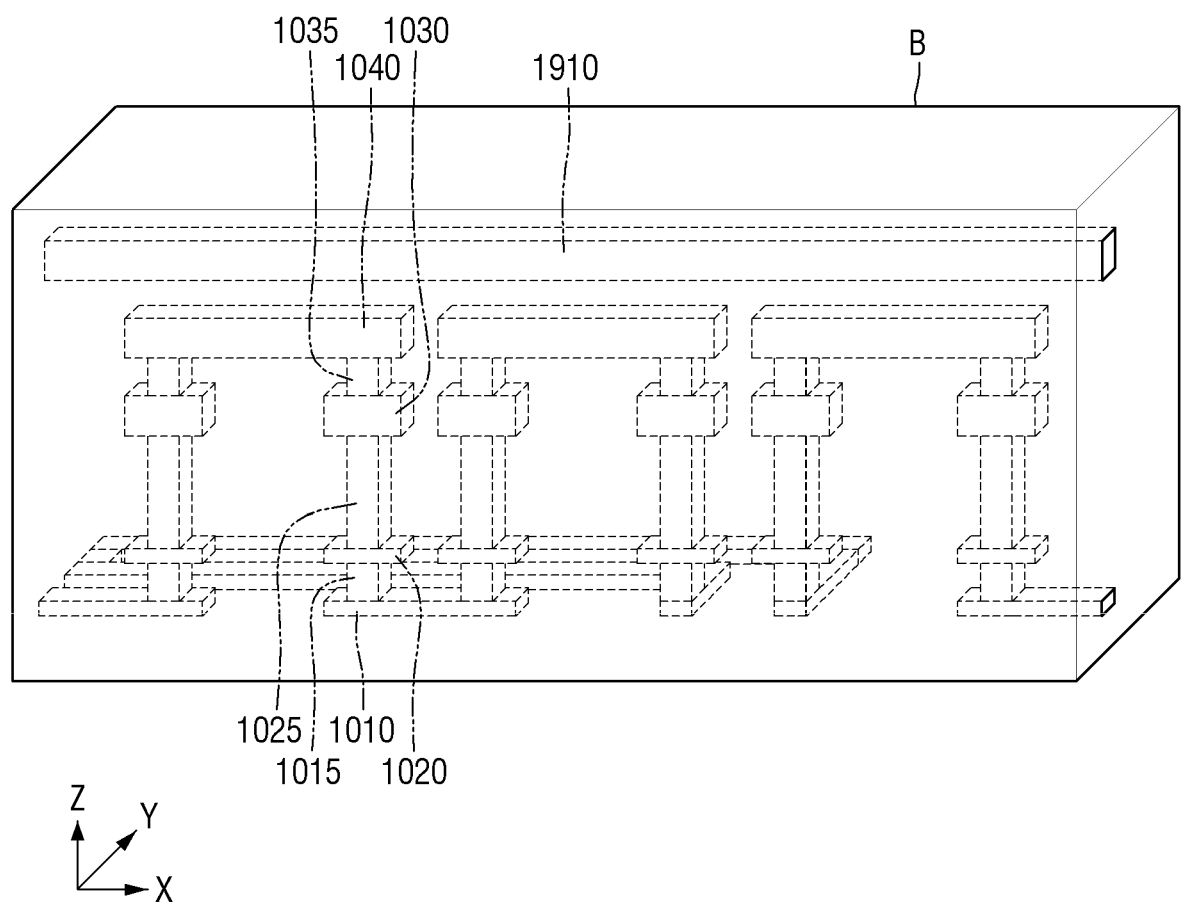

Referring to FIG. 25, the crack detection structure (CDS) according to some example embodiments may include a third metal pattern 1910. The first poly pattern 1010 may correspond to the lower horizontal pattern 630. In some example embodiments, a part of the lower horizontal pattern 630 may be formed in a snake pattern. The other part of the lower horizontal pattern 630 may be formed in a straight line (-) pattern.

Figure 26:
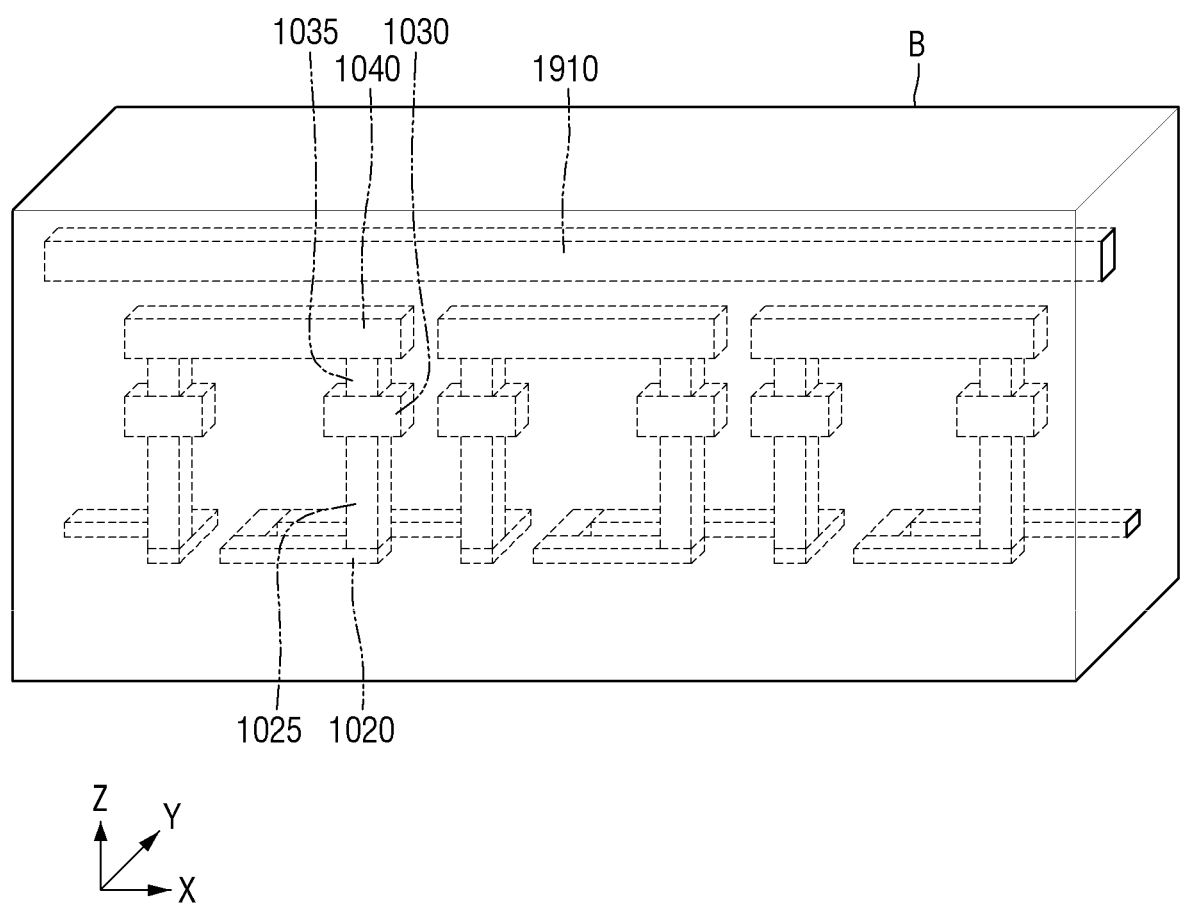

Referring to FIG. 26, the crack detection structure (CDS) according to some example embodiments may include a third metal pattern 1910. The second poly pattern 1020 may correspond to the lower horizontal pattern 630. In some example embodiments, all the lower horizontal patterns 630 may be formed in a snake pattern.

Figure 27:
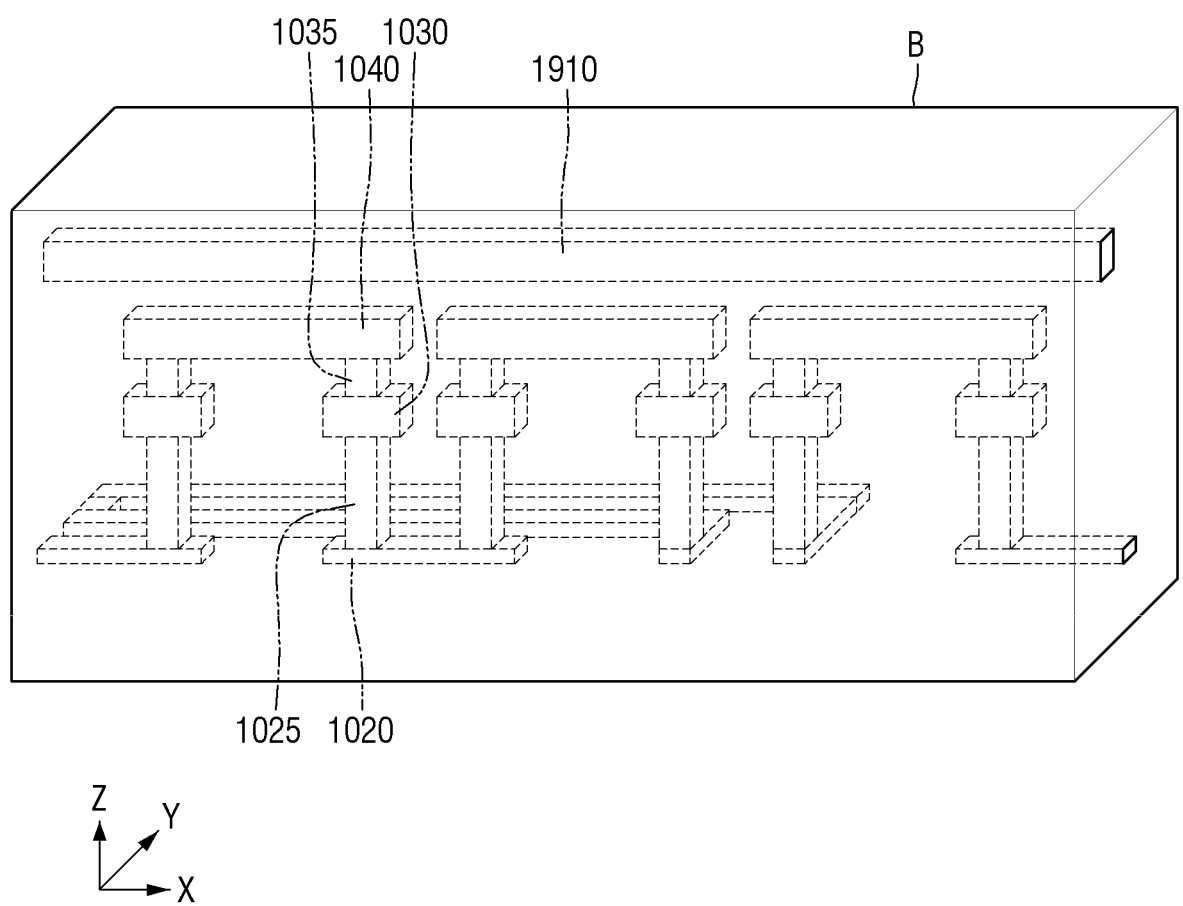

Referring to FIG. 27, the crack detection structure (CDS) according to some example embodiments may include a third metal pattern 1910. The second poly pattern 1020 may correspond to the lower horizontal pattern 630. In some example embodiments, a part of the lower horizontal pattern 630 may be formed in a snake pattern. The other part of the lower horizontal pattern 630 may be formed in a straight line (-) pattern.

For example, the crack detection structure (CDS) of FIGS. 24 to 27 may further include a ring type pattern 1900 in which the third metal pattern 1910 is included in the crack detection structure (CDS) of FIGS. 13 and 16 to 18, respectively.

In some of the drawings, the crack detection structure (CDS) is illustrated as having a rectangular or rectangular parallelepiped shape, but example embodiments are not limited thereto. Those having ordinary skill in the technical field of the present inventive concepts may implement crack detection structures (CDS) of various shapes.

FIGS. 28, 29A, 29B, and 30 are diagrams and a flowchart for illustrating a crack detection method according to an example embodiment.

Figure 28:
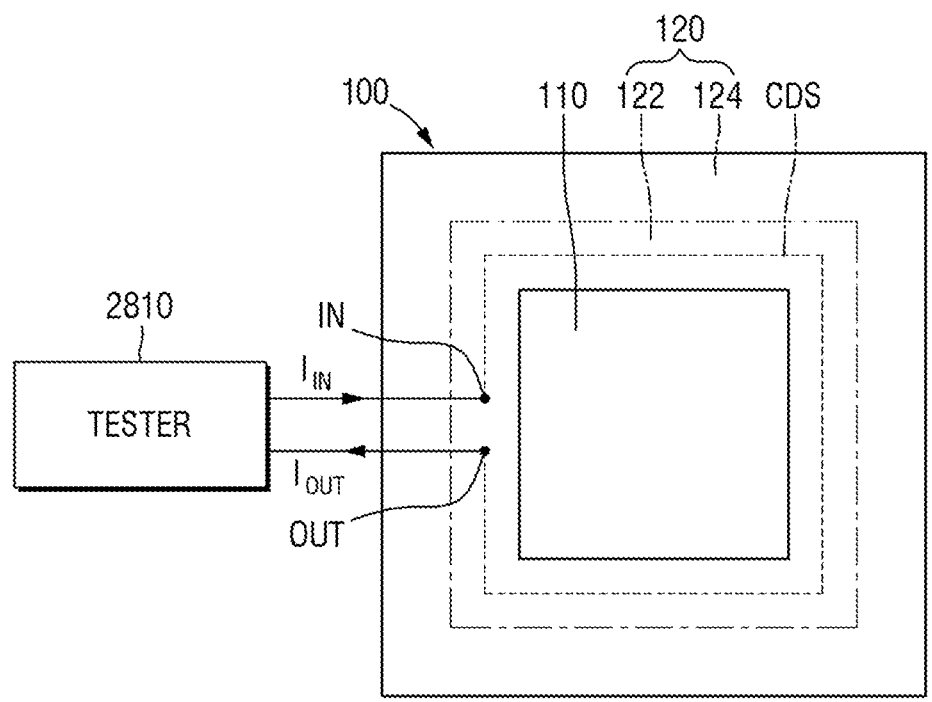
FIGS. 28, 29A, 29B, and 30 are diagrams and a flowchart for illustrating a crack detection method according to an example embodiment.
Figure 29A:
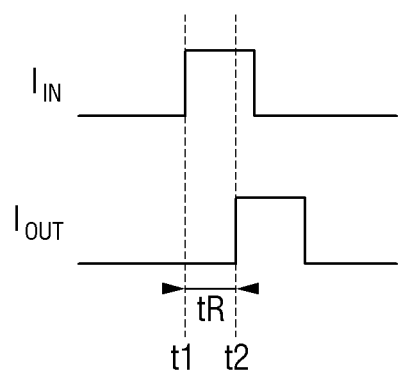
Figure 29B:
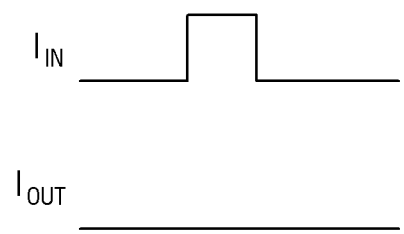
Figure 30:
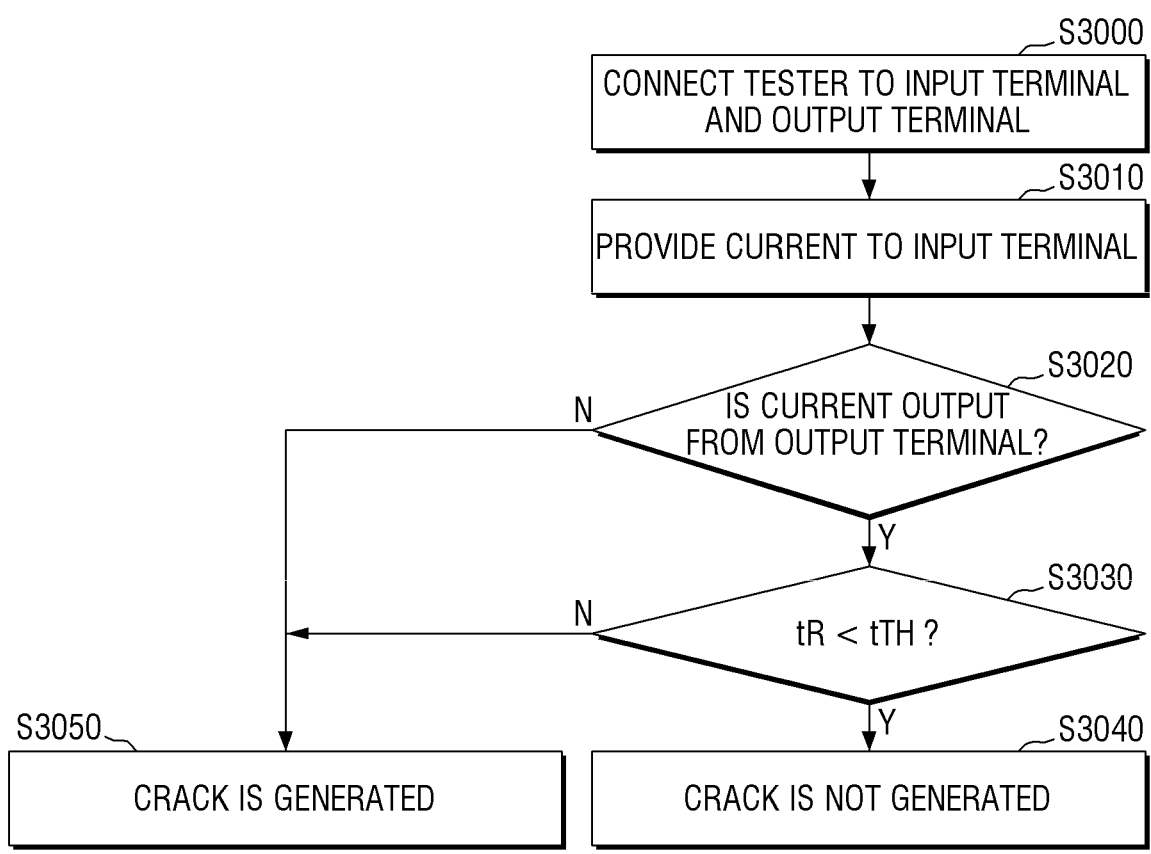

Referring to FIGS. 28 to 30, in order to detect whether or not a crack is formed in the semiconductor device 100, a tester 2810 may be connected to the semiconductor device 100. For example, the tester 2810 may be connected to the input terminal (IN) and the output terminal (OUT) of the crack detection structure (CDS) included in the semiconductor device 100 (S3000). At this time, the input terminal (IN) and the output terminal (OUT) of the crack detection structure (CDS) may be input/output terminals of the net type pattern 600 and/or the ring type pattern 1900 described above.

The tester 2810 may provide the input current ($T_{IN}$) to the input terminal (IN) of the crack detection structure (CDS) (S3010).

The tester 2810 may determine whether or not a crack is formed in the semiconductor device 100 on the basis of the received output current ($I_{OUT}$). For example, the tester 2810 may measure the output current ($I_{OUT}$) provided from the output terminal (OUT) of the crack detection structure (CDS) (S3020).

When the tester 2810 is provided with the output current ($I_{OUT}$) from the output terminal (OUT) of the crack detection structure (CDS), the tester 2810 may determine how long the output current ($I_{OUT}$) is delayed, as compared to the input current ($T_{IN}$). For example, as illustrated in FIG. 29A, it is possible to determine the output delay time (tR), using the time t1 at which the input current ($T_{IN}$) rises, and the time t2 at which the output current ($I_{OUT}$) rises. The tester 2810 may determine whether the output delay time (tR) is smaller than a predetermined or desired threshold time (tTH) (S3030). For example, the tester 2810 may determine whether the output current ($I_{OUT}$) reaches or outputs within the predetermined or desired threshold time (tTH) after the input current ($T_{IN}$) is provided.

When the output delay time (tR) is smaller than the predetermined or desired threshold time (tTH), in other words, when the output current ($I_{OUT}$) reaches or rises within the predetermined or desired threshold time (tTH), the tester 2810 may determine that no crack is generated in the semiconductor device 100 (S3040).

When the tester 2810 may not receive the output current ($I_{OUT}$) from the output terminal (OUT) of the crack detection structure (CDS), the tester 2810 may determine that a crack is generated in the semiconductor device. Further, when the output delay time (tR) is greater than a predetermined or desired threshold time (tTH), the tester 2810 may determine that a crack is generated in the semiconductor device 100 (S3050).

Referring to FIG. 19, the net type pattern 600 may be connected with a single line from the first input terminal (IN1) to the first output terminal (OUT1) without disconnection. Likewise, the ring type pattern 1900 may also be connected with a single line from the second input terminal (IN2) to the second output terminal (OUT2) without disconnection.

In some example embodiments, when some of the upper horizontal pattern 610, the vertical pattern 620, and/or the lower horizontal pattern 630 included in the net type pattern 600 are destroyed due to crack, the resistance of the upper horizontal pattern 610, the vertical pattern 620, and/or the lower horizontal pattern 630 may increase and the output delay time (tR) may increase. Therefore, when the output delay time (tR) is larger than the predetermined or desired threshold time (tTH), the semiconductor device 100 may be determined to be defective.

In some example embodiments, when a part of the third metal pattern 1910 included in the ring type pattern 1900 is destroyed due to crack, the resistance of the third metal pattern 1910 rises, and the output delay time (tR) may increase. Therefore, when the output delay time (tR) is larger than the predetermined or desired threshold time (tTH), the semiconductor device 100 may be determined to be defective.

In some example embodiments, when the upper horizontal pattern 610, the vertical pattern 620, and/or the lower horizontal pattern 630 included in the net type pattern 600 are destroyed due to crack, the upper horizontal pattern 610, the vertical pattern 620, and/or the lower horizontal pattern 630 may be electrically disconnected. That is to say, when the crack penetrates the interior of the semiconductor device 100, the net type pattern 600 may be in an open state. In such a case, the output current ($I_{OUT}$) received by the tester 2810 may not exist (see FIG. 29B). Therefore, when the output current ($I_{OUT}$) received by the tester 2810 does not exist, the semiconductor device 100 may be determined to be defective.

In some example embodiments, when the third metal pattern 1910 included in the ring type pattern 1900 is destroyed due to the crack, the third metal pattern 1910 may be electrically disconnected. For example, when the crack penetrates the interior of the semiconductor device 100, the ring type pattern 1900 may be in an open state. In such a case, the output current ($I_{OUT}$) received by the tester 2810 may not exist (see FIG. 29B). Therefore, when the output current ($I_{OUT}$) received by the tester 2810 does not exist, the semiconductor device 100 may be determined to be defective.

In concluding the detailed description, those skilled in the art will appreciate that many variations and modifications can be made to the disclosed example embodiments without substantially departing from the principles of the present inventive concepts. Therefore, the disclosed example embodiments of the inventive concepts are used in a generic and descriptive sense only, and are not described for purposes of limitation.

What is claimed is:
1. A semiconductor device comprising:
a substrate including a central region and a peripheral region surrounding the central region;
a semiconductor integrated circuit in the central region; and
a three-dimensional crack detection structure in the peripheral region, the three-dimensional crack detection structure surrounding the central region, the three-dimensional crack detection structure including a first pattern, a second pattern, and a third pattern, the first and second patterns extending in a first direction and spaced apart from each other, the third pattern being parallel to an upper surface of the substrate and connecting the first and second patterns to each other, the third pattern including a first portion and a second portion, the first and second portions extending in a second direction and a third direction respectively, the second direction intersecting with the first direction, the third direction intersecting with the first and second directions.

2. The semiconductor device of claim 1, wherein the first portion of the third pattern is between the second portion of the third pattern and the first pattern.

3. The semiconductor device of claim 1, further comprising:
a crack prevention structure in the peripheral region,
wherein the three-dimensional crack detection structure is between the crack prevention structure and the semiconductor integrated circuit.

4. The semiconductor device of claim 3, wherein the crack prevention structure is configured to prevent a crack generated by an external factor from entering the semiconductor integrated circuit.

5. The semiconductor device of claim 1, wherein the three-dimensional crack detection structure further comprises a fourth pattern on the first, second, and third patterns and parallel to the upper surface of the substrate, one end of the fourth pattern is connected to an input terminal, and the other end of the fourth pattern is connected to an output terminal.

6. The semiconductor device of claim 1, wherein the three-dimensional crack detection structure further comprises a fourth pattern extending in the first direction and spaced apart from the first and second patterns, and a fifth pattern connecting the second and fourth patterns to each other.

7. The semiconductor device of claim 6, wherein the three-dimensional crack detection structure further comprises a sixth pattern extending in the first direction and spaced apart from the first pattern, the second pattern, and the fourth pattern, and a seventh pattern connecting the fourth and sixth patterns to each other.

8. The semiconductor device of claim 7, wherein the third pattern and the seventh pattern include poly-crystal material, and the fifth pattern includes metal.

9. The semiconductor device of claim 1, wherein at least a part of the third pattern is configured to be destroyed by a nano crack penetrating into the third pattern.

10. A semiconductor device comprising:
a substrate including a first region and a second region surrounding the first region;
a first semiconductor structure in the first region; and
a second semiconductor structure in the second region, the second semiconductor structure including a crack detection structure (CDS), the CDS including a net type pattern both ends of which are connected to a first input terminal and a first output terminal, respectively, the net type pattern including a plurality of vertical patterns parallel to each other, a plurality of upper patterns connecting upper portions of the plurality of vertical patterns, and a plurality of lower patterns connecting lower portions of the plurality of vertical patterns, a length of each of the plurality of upper patterns being smaller than a length of each of the plurality of lower patterns.

11. The semiconductor device of claim 10, further comprising:
a crack prevention structure in the second region,
wherein the CDS is between the crack prevention structure and the first semiconductor structure.

12. The semiconductor device of claim 11, wherein the crack prevention structure is configured to prevent a crack generated by an external factor from entering the first semiconductor structure.

13. The semiconductor device of claim 10, wherein the CDS further comprises a ring type pattern on the net type pattern, and first and second terminals of the ring type pattern are connected to a second input terminal and a second output terminal, respectively.

14. The semiconductor device of claim 10, wherein a length of each of the plurality of upper patterns is smaller than a length of each of the plurality of lower patterns.

15. The semiconductor device of claim 10, wherein at least a part of the plurality of lower patterns is configured to be destroyed by a nano crack penetrating into the at least a part of plurality of lower patterns.

16. The semiconductor device of claim 10, wherein the plurality of upper patterns includes metal.

17. The semiconductor device of claim 10, wherein the plurality of lower patterns includes poly-crystal material.

18. A semiconductor device comprising:
a substrate including a central region and a peripheral region surrounding the central region;
a semiconductor integrated circuit in the central region; and
a three-dimensional crack detection structure in the peripheral region and surrounding the central region, the three-dimensional crack detection structure including a first vertical pattern and a second vertical pattern, the first and second vertical patterns spaced apart from each other and extending in a first direction, the first and second vertical patterns being along a first line surrounding the central region, a horizontal pattern connecting the first and second vertical patterns to each other, the horizontal pattern being parallel to an upper surface of the substrate, at least a part of the horizontal pattern being outside the first line.

19. The semiconductor device of claim 18, wherein at least a part of the first horizontal pattern is formed in a snake shape.

20. The semiconductor device of claim 18, wherein the first horizontal pattern includes poly-crystal material.

* * * * *